United States Patent
Tin et al.

(10) Patent No.: US 9,842,812 B2
(45) Date of Patent: Dec. 12, 2017

(54) SELF-DESTRUCTING CHIP

(71) Applicants: Honeywell International Inc., Morristown, NJ (US); Cornell University, Ithaca, NY (US)

(72) Inventors: Steven Tin, Plymouth, MN (US); Jeffrey James Kriz, Eden Prairie, MN (US); Steven J. Eickhoff, Brooklyn Park, MN (US); Jeff A. Ridley, Shorewood, MN (US); Amit Lal, Ithaca, NY (US); Christopher Ober, Ithaca, NY (US); Serhan Ardanuc, Ithaca, NY (US); Ved Gund, Ithaca, NY (US); Alex Ruyack, Ithaca, NY (US); Katherine Camera, Ithaca, NY (US)

(73) Assignee: Honeywell International Inc., Morris Plains, NJ (US)

( * ) Notice: Subject to any disclaimer, the term of this patent is extended or adjusted under 35 U.S.C. 154(b) by 247 days.

(21) Appl. No.: 14/660,726

(22) Filed: Mar. 17, 2015

(65) Prior Publication Data
US 2017/0025365 A1    Jan. 26, 2017

Related U.S. Application Data

(60) Provisional application No. 61/969,556, filed on Mar. 24, 2014.

(51) Int. Cl.
*H01L 23/00* (2006.01)
*H01M 8/2475* (2016.01)
(Continued)

(52) U.S. Cl.
CPC ............ *H01L 23/564* (2013.01); *B29C 35/02* (2013.01); *B81B 7/0077* (2013.01);
(Continued)

(58) Field of Classification Search
CPC .................................................. H01L 23/5252
See application file for complete search history.

(56) References Cited

U.S. PATENT DOCUMENTS 3,697,668 A    10/1972   Campbell
3,882,323 A    5/1975    Smolker
(Continued)

FOREIGN PATENT DOCUMENTS

CN          103378056      10/2013

OTHER PUBLICATIONS

McGraw-Hill Dictionary of Scientific and Technical Terms, 6th edition, published by the McGraw-Hill Companies, Inc., 2 pages, 1997.*

(Continued)

*Primary Examiner* — Hai L Nguyen
(74) *Attorney, Agent, or Firm* — Fogg & Powers LLC

(57) ABSTRACT

Embodiments herein provide for a self-destructing chip including at least a first die and a second die. The first die includes an electronic circuit, and the second die is composed of one or more polymers that disintegrates at a first temperature. The second die defines a plurality of chambers, wherein a first subset of the chambers contain a material that reacts with oxygen in an exothermic manner. A second subset of the chambers contain an etchant to etch materials of the first die. In response to a trigger event, the electronic circuit is configured to expose the material in the first subset of chambers to oxygen in order to heat the second die to at least the first temperature, and is configured to release the etchant from the second subset of the chambers to etch the first die.

15 Claims, 14 Drawing Sheets

(51) Int. Cl.
| | |
|---|---|
| B29C 35/02 | (2006.01) |
| B81B 7/00 | (2006.01) |
| B81C 1/00 | (2006.01) |
| C23C 16/26 | (2006.01) |
| C23C 16/44 | (2006.01) |
| H01L 21/02 | (2006.01) |
| H01L 21/268 | (2006.01) |
| H01L 21/306 | (2006.01) |
| H01L 21/311 | (2006.01) |
| H01L 21/768 | (2006.01) |
| H01L 25/16 | (2006.01) |
| H01L 23/58 | (2006.01) |
| B29L 31/34 | (2006.01) |

(52) U.S. Cl.
CPC ......... *B81C 1/00333* (2013.01); *C23C 16/26* (2013.01); *C23C 16/44* (2013.01); *H01L 21/02118* (2013.01); *H01L 21/268* (2013.01); *H01L 21/30604* (2013.01); *H01L 21/31133* (2013.01); *H01L 21/76837* (2013.01); *H01L 21/76877* (2013.01); *H01L 21/76898* (2013.01); *H01L 23/57* (2013.01); *H01L 23/573* (2013.01); *H01L 23/576* (2013.01); *H01L 25/16* (2013.01); *H01M 8/2475* (2013.01); *B29L 2031/34* (2013.01); *B81B 2201/0257* (2013.01); *B81B 2201/0264* (2013.01); *B81B 2203/0127* (2013.01); *B81C 2201/013* (2013.01); *H01L 23/58* (2013.01); *H01L 2223/6677* (2013.01); *H01L 2924/0002* (2013.01); *H01L 2924/14* (2013.01)

(56) References Cited

U.S. PATENT DOCUMENTS

| | | | |
|---|---|---|---|
| 4,849,363 | A | 7/1989 | Coffey et al. |
| 5,603,111 | A | 2/1997 | Wyatt |
| 5,736,777 | A | 4/1998 | Shield et al. |
| 6,926,204 | B2 | 8/2005 | Vacherand et al. |
| 7,666,485 | B2 | 2/2010 | Lal et al. |
| 7,757,200 | B2 * | 7/2010 | Moy .................. H01L 23/5256 257/529 |
| 8,330,191 | B2 | 12/2012 | Hoofman et al. |
| 9,024,394 | B2 * | 5/2015 | Poirier .................. B02C 23/00 156/345.37 |
| 2009/0070887 | A1 | 3/2009 | Knowles et al. |
| 2012/0068326 | A1 | 3/2012 | Das et al. |

OTHER PUBLICATIONS

European Patent Office, "Extended European Search Report from EP Application No. 15159723.4 dated Aug. 26, 2015", "from Foreign Counterpart of U.S. Appl. No. 14/660,726", dated Aug. 26, 2015, pp. 1-6, Published in: EP.

* cited by examiner

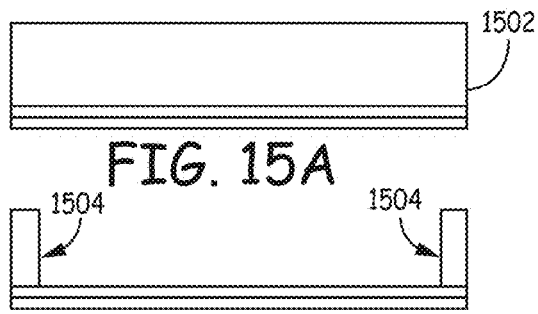
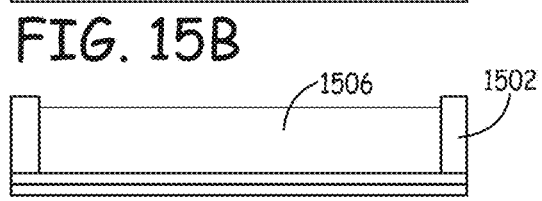
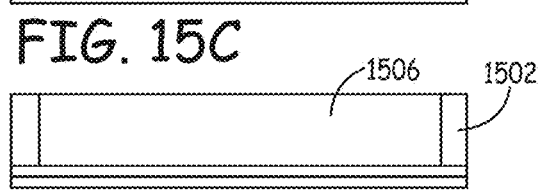
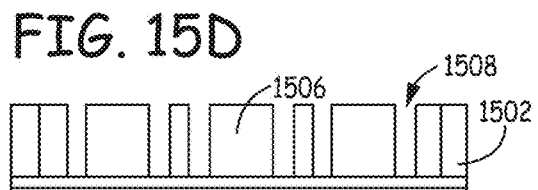
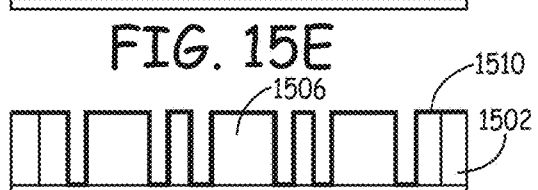
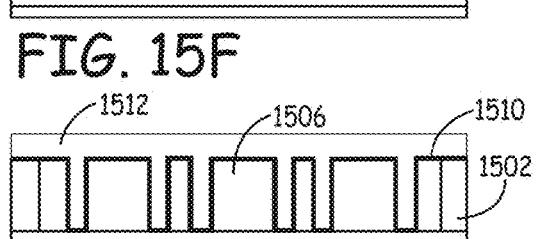
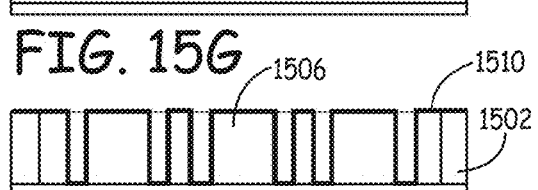
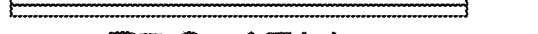
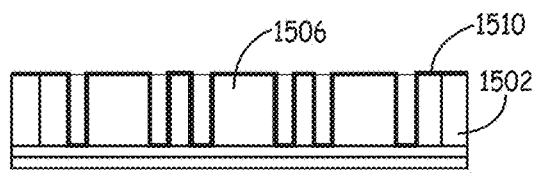
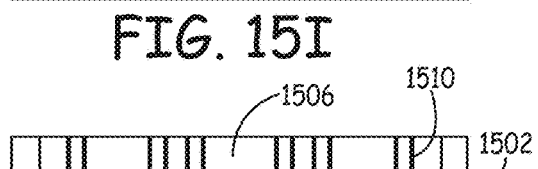
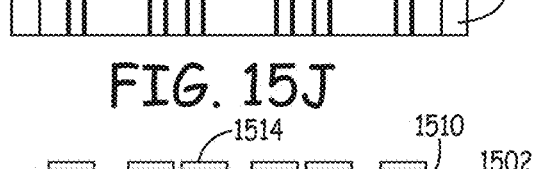
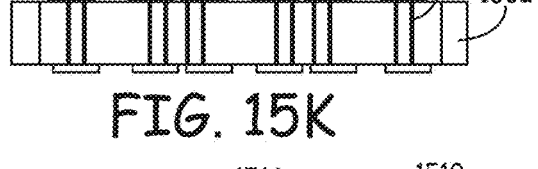
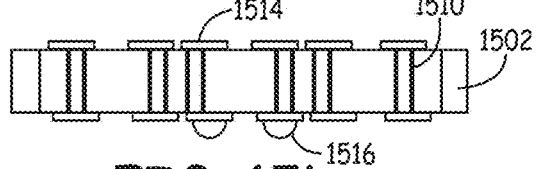
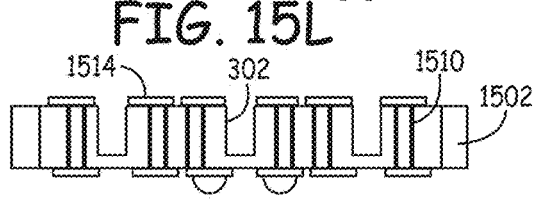

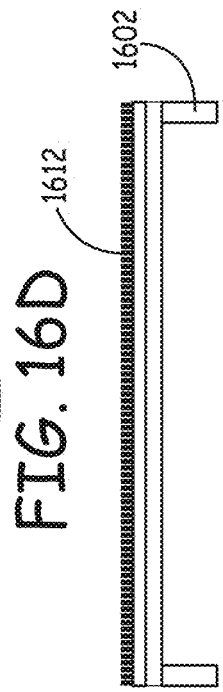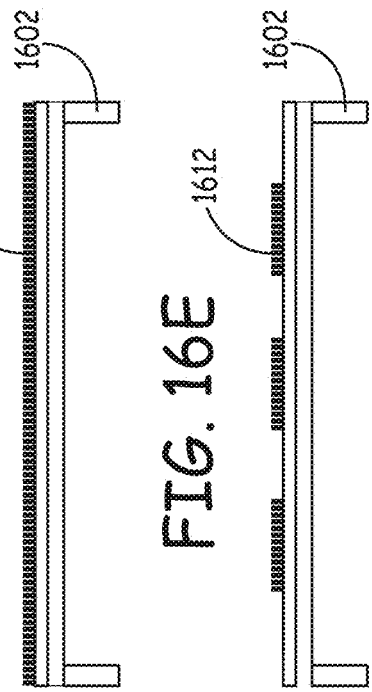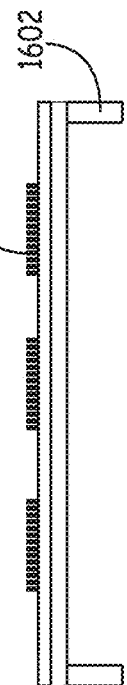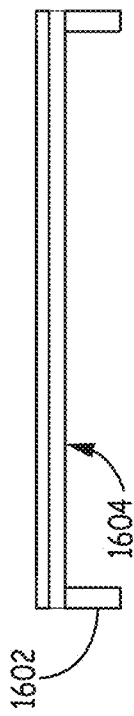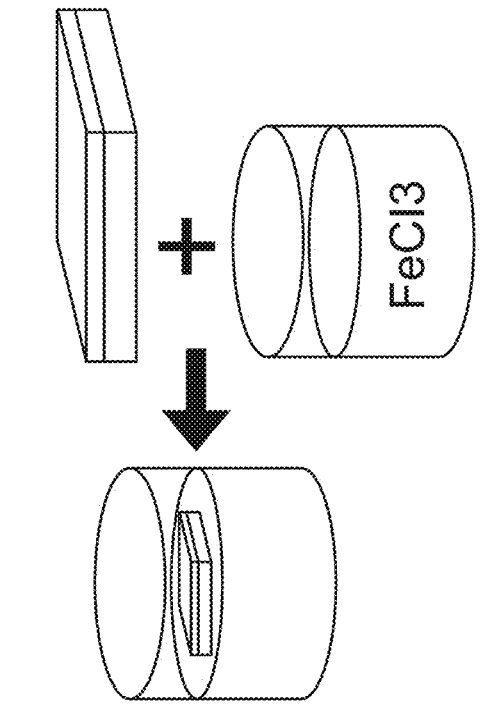

SELF-DESTRUCTING CHIP

CROSS-REFERENCE TO RELATED APPLICATIONS

This application claims the benefit of U.S. Provisional Patent Application Ser. No. 61/969,556, filed on Mar. 24, 2014, which is hereby incorporated herein by reference.

STATEMENT REGARDING FEDERALLY SPONSORED RESEARCH OR DEVELOPMENT

This invention was made with Government support under contract No. FA8650-14-C-7402 awarded by USAF/AFMC. The Government has certain rights in the invention.

BACKGROUND

Sophisticated electronics can be made at low cost and are increasingly pervasive throughout the battlefield. Large numbers can be widely proliferated and used for applications such as distributed remote sensing and communications. However, it is nearly impossible to track and recover every device, resulting in unintended accumulation in the environment and potential unauthorized use and compromise of intellectual property and technological advantage.

SUMMARY

Embodiments herein provide for a self-destructing chip including at least a first die and a second die. The first die includes an electronic circuit, and the second die is composed of a polymer that disintegrates at a first temperature. The second die defines a plurality of chambers, wherein a first subset of the chambers contain a material that reacts with oxygen in an exothermic manner. A second subset of the chambers contain an etchant to etch materials of the first die. In response to a trigger event, the electronic circuit is configured to expose the material in the first subset of chambers to oxygen in order to heat the second die to at least the first temperature, and is configured to release the etchant from the second subset of the chambers to etch the first die.

DRAWINGS

Understanding that the drawings depict only examples and are not therefore to be considered limiting in scope, the examples will be described with additional specificity and detail through the use of the accompanying drawings, in which.

Figure 3:
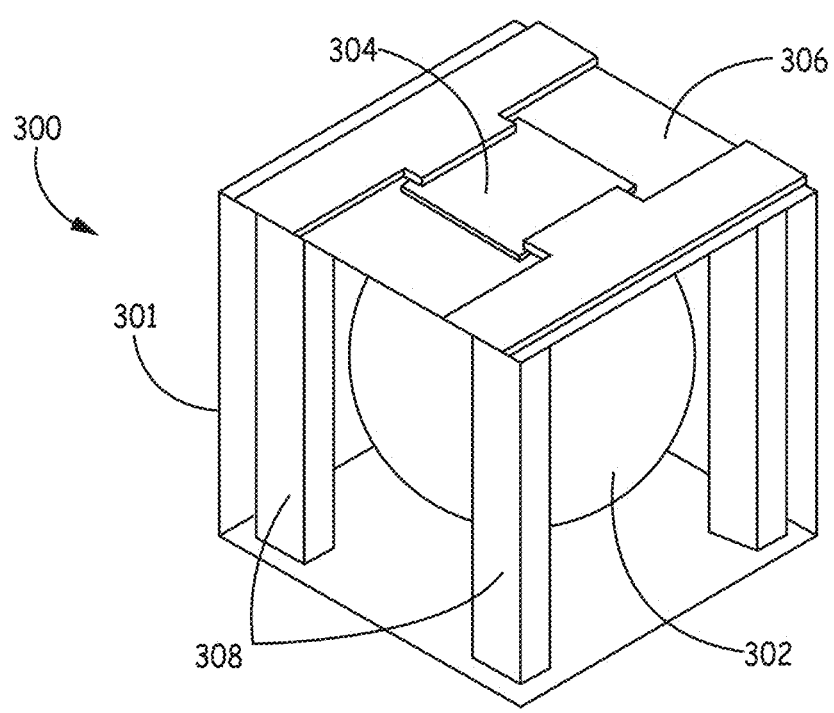
FIG. 3 is a perspective view of an example polymer cube used in the SDC of FIG. 1A.

FIGS. 15A-N are example stages in the fabrication of a die including a plurality of cubes of FIG. 3.

FIGS. 16A-F are example stages in the fabrication of an oxygen and humidity barrier sheet to cover a chamber of a cube of FIG. 3.

Figure 17A:
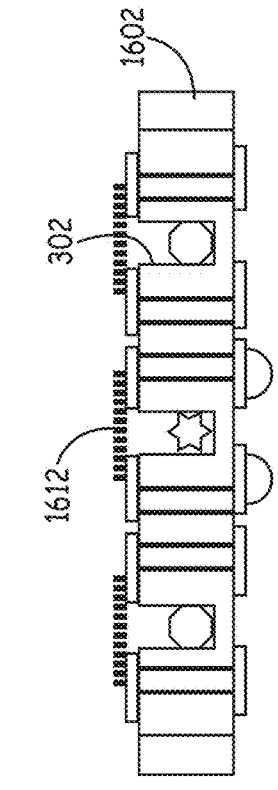
Figure 17B:
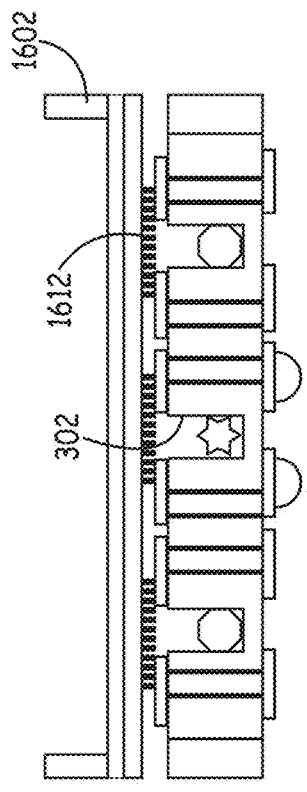

FIGS. 17A and 17B are example stages in the transfer of the oxygen and humidity barrier sheet of FIGS. 16A-F to the die of FIGS. 15A-N.

Figure 18A:
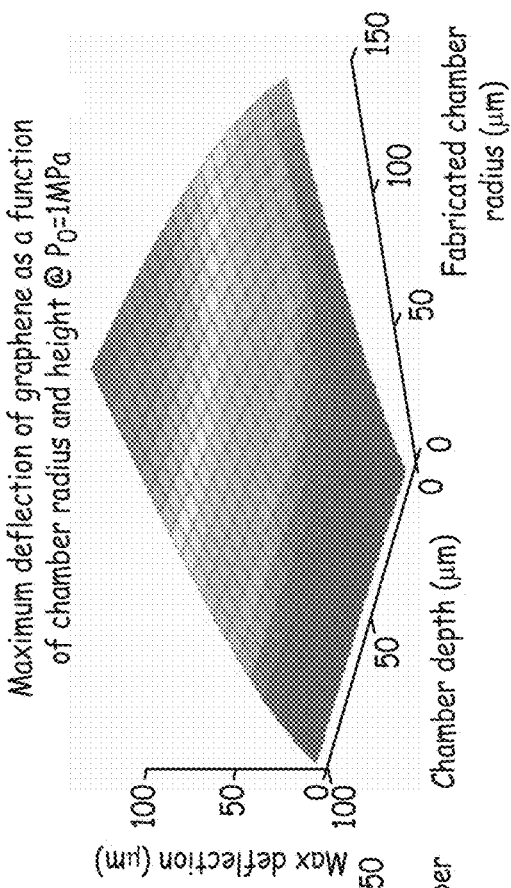
Figure 18B:
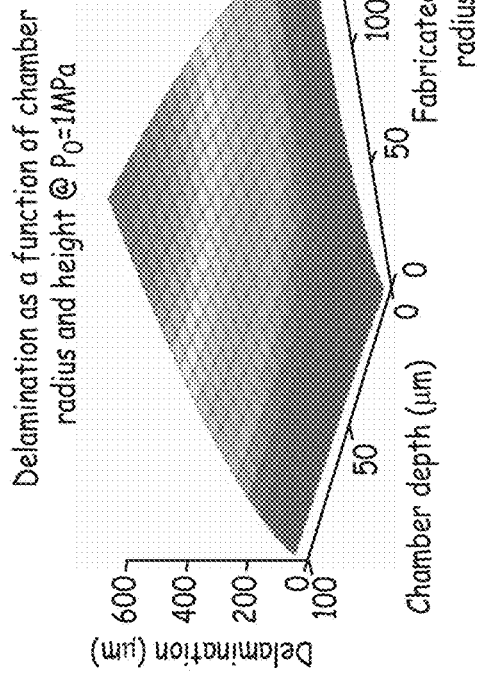

FIGS. 18A-18B are example graphs regarding delamination of the oxygen and humidity barrier sheet from an opening of a chamber in a cube of FIG. 3.

In accordance with common practice, the various described features are not drawn to scale but are drawn to emphasize specific features relevant to the examples. Like reference numbers and designations in the various drawings indicate like elements.

DETAILED DESCRIPTION

Embodiments described herein provide for a self-destructing electronic chip (SDC) that is capable of disintegrating (e.g., physically disappearing) in a controlled, triggerable manner. Examples discussed herein related to a chip configured to perform remote sensing of the environment, however, the self-destructing design described herein can be applied to a chip configured for any suitable purpose. In some examples, components of the SDC and the SDC itself are described herein as being transient, which refers to the ability of the component/chip to disintegrate (e.g., physically disappear) through total or partial vaporization, sublimation, etching, burning, or other process. In an example, the SDC can self-destruct at one of two time scales—one in seconds and another on the order of days by UV degradation.

In an example, SDC comprises a miniature wafer level fabricated chip on the scale of 1 cm×1 cm×0.5 cm to promote covert operation and enable rapid transience once commanded. In such an example, the SDC contains components to sense AC magnetic fields of vehicles or nearby power lines/machinery and audio signatures. The SDC can include a low power 2-way wireless transceiver to communicate any AC field or audio signatures recorded by the SDC to dismounted, vehicle, relay or overhead assets. The wireless transceiver can be configured to receive a command to self-destruct (e.g., disintegrate) or alternatively autonomously self-destruct at the end of the SDC's useful fuel cell lifetime.

In an example, some components of the SDC are composed of one or more polymers that can transform from solid to gas within a tunable temperature range of 120 C to 150 C. The polymer(s) can be selected from among several families of polymers that when subjected to specific conditions, will revert to monomer, the volatile building block of polymers. The common features of these families of polymers include the presence of an alpha methyl group on the polymer backbone that stabilizes the reactive species and leads to the monomer being thermodynamically favored at operating temperatures, yet still enables formation of the polymer at low temperatures. Heat and/or radiation can be used to trigger the reversion of the polymer(s) to monomer(s) but under normal use conditions, the polymer(s) is quite stable. In an example, the SDC uses these and/or related polymers and specific triggers to create vanishing electronics. This same polymer(s) can also be used in the SDC as the structural material for micropackets of reactants that generate controlled amount of heat and etchants to etch the glass and silicon component of the silicon chips while also providing enough thermal energy to sublimate the package itself.

Examples of polymers that can be used for components of the SDC and can transform from solid to gas at a defined temperature or temperature range include a polymer developed by Cornell University that is referred to as Cornell Vaporizable Poly-Carbonate (CVPC), blends of polymers, and composites including mixtures of CVPC with one or more additives such as an additive used to improve mechanical performance. Although this application refers primarily to CVPC as the polymer used for various components, it should be understood that other suitable polymers can also be used, as described above.

Figure 1:
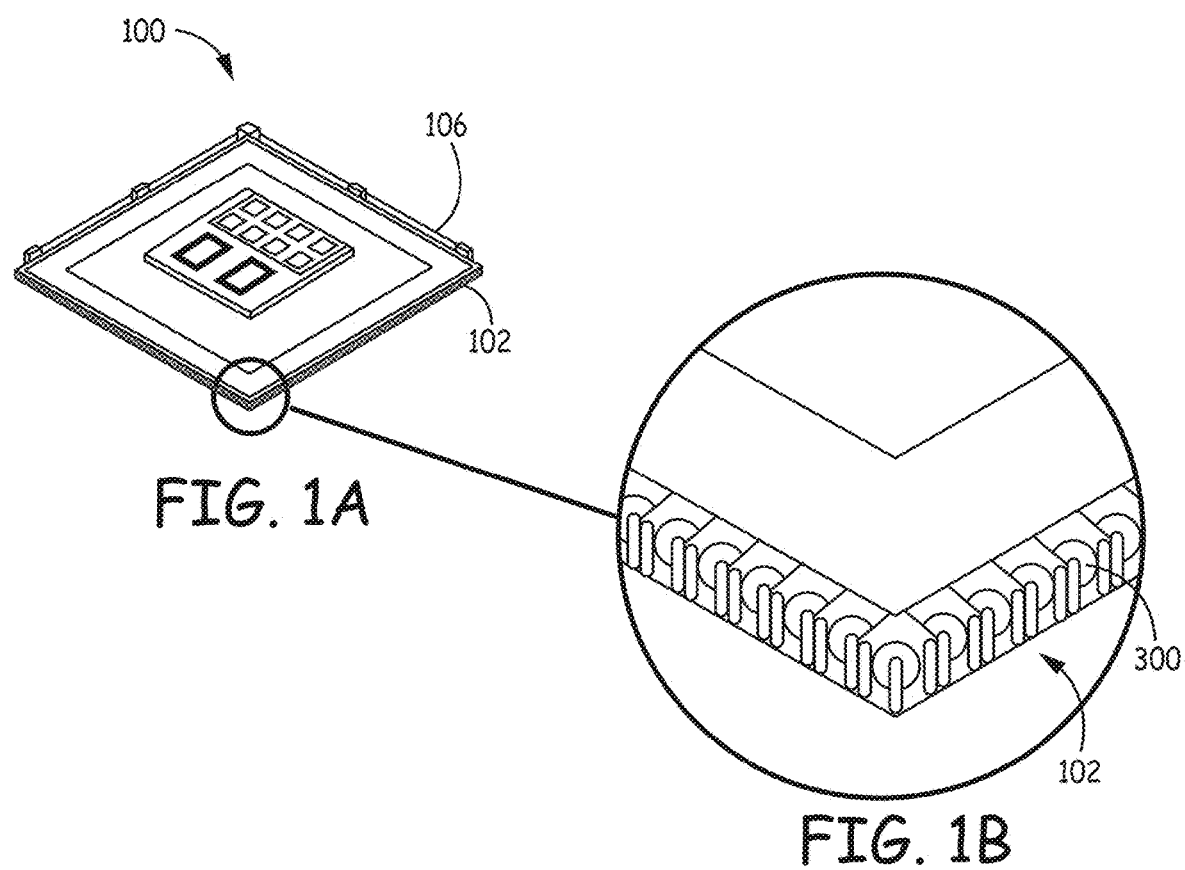
FIG. 1A is a perspective view of an example self-destructing electronic chip (SDC).
FIG. 1B is an enlarged perspective view of a portion of a layer within the SDC of FIG. 1A.
Figure 2:
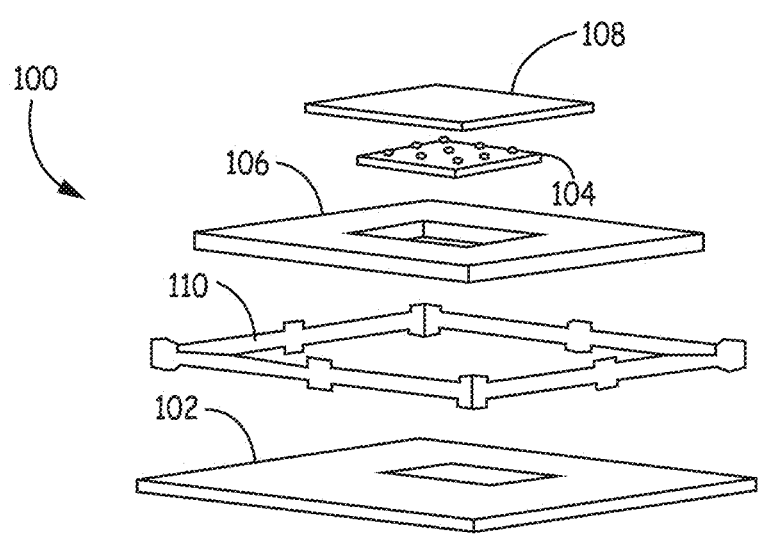
FIG. 2 is an exploded view of the example SDC of FIG. 1A.

FIG. 1A is perspective view of an example SDC 100. An exploded view of the example SDC 100 is shown in FIG. 2. In an example, the complete package of the SDC 100 has lateral dimensions of ~1 cm and thickness of about 0.5 cm. The example SDC 100 includes an integrated circuit 104 disposed between a bottom disintegration fuel and etchant storage layer 102, and a top disintegration fuel and etchant storage layer 108. The bottom layer 102 and the top layer 108 can be composed of a plurality of CVPC cubes 300 arrayed in a die as discussed in more detail below. The top layer 108 and/or the bottom layer 102 can also include an antenna and graphene microphone sensors on the CVPC cubes 300.

In an example, power for the integrated circuit 104 is provided by a power source that is included within the SDC 100. In other examples, power is provided for the integrated circuit 104 from an external power source. Example power sources that can be included within the SDC 100 include a fuel cell, battery, and an energy harvester (e.g., solar power harvester (e.g., photovoltaic cell), thermal energy harvester, kinetic energy harvester, electromagnetic energy harvester, etc.). The example power source shown in FIGS. 1A and 2 is a fuel cell 106. In an example, the fuel-cell 106 is composed of CVPC and CVPC integrated nafion. In an example, the fuel cell 106 has an annular shape and is disposed between the bottom layer 102 and the top layer 108. In an example, the integrated circuit 104 is disposed within the aperture of the annular shaped fuel cell 106, between the bottom layer 102 and the top layer 108.

FIG. 3 is a perspective view of an example CVPC cube 300 which makes up the bottom layer 102 and the top layer 108 of the SDC 100. That is, a plurality of cubes 300 are arrayed in a die to form the bottom layer 102 and the top layer 108 as shown in FIGS. 1A and 1B. The CVPC cube 300 has a body 301 composed of CVPC. The body 301 defines a chamber 302 having a material therein that reacts with oxygen exothermically. In an example, the chamber 302 (and the material therein) has a generally spherical shape (discussed more below). Examples of a suitable material that reacts exothermically with oxygen include the alkaline metals (e.g., rubidium or cesium), as well as simple and complex metal hydrides. An oxygen and humidity barrier sheet (OHBS) 304 (e.g., a sheet composed of graphene) can cover an opening of the chamber 302 to impede oxygen from entering the chamber. The OHBS 304 can be disposed on a silicon nitride ($Si_xN_y$) layer 306 which is disposed on the side of the cube 300 having the chamber opening therein. The OHBS 304 is disposed over the opening to close up the chamber 302. The OHBS 304 is configured to delaminate (e.g., in response to a trigger event) by passing current through the OHBS 304. The OHBS 304 is coupled in series between two electrodes such that the current can be passed through the OHBS 304 via the two electrodes. This exposes the Rb/Cs to oxygen (e.g., atmospheric air) causing the Rb/Cs to exothermically react with oxygen and raise the temperature of CVPC to sublimation. In an example, the cube 300 also includes thru-polymer interconnects 308 to couple the OHBS 304 to electronic circuit connected to the bottom of the CVPC cube 300. One or more traces can be disposed on the $Si_xN_y$ layer 306 to couple the OHBS 304 to the interconnects 308. In an example, the CVPC cube 300 has dimensions of 250 μm by 250 μm by 250 μm.

The integrated circuit 104 can be composed of a thinned SOI-CMOS die disposed on a handle composed of a polycarbonate such as CVPC. CVPC in the handle and elsewhere around the SOI-CMOS die can be implanted with a hydrofluoric acid precursor such as fluorine to form HF which further destructs the handle (described more below). To form such a thinned SOI-CMOS die on a polycarbonate handle, a SOI-CMOS die is released from a SOI wafer such that the total thickness of the SOI-CMOS die is only 6-10 um. This thin SOI-CMOS die can be transferred to a polycarbonate handle with metal lines. Thin pieces of SOI-CMOS die such as these can be transferred by first transferring a full thickness silicon die having the SOI-CMOS component thereon to the polycarbonate handle, and then using a confined vapor HF to release the silicon bulk from the backside of the full thickness silicon die. A subset of the CVPC cubes in the CVPC cube layer 102 and/or the top layer 108 below and above the integrated circuit can contain one or more etchants such as $XeF_2$ for vaporizing the SOI-CMOS die. The SDC 100 can also include a CVPC spacer 110 can be used to provide air intake openings for the fuel cell 106.

When a trigger event occurs, the OHBS(s) 304 (e.g., valves) covering the opening of each chamber 302 are heated by passing electrical current through the OHBS(s) 304. This causes graphene oxidation, delamination, and/or cracking, which opens the chambers 302, and exposes the alkali metal therein to oxygen. The reaction of the alkali metal and oxygen releases heat that can cause the SDC 100 to reach temperatures of 120 C to 150 C. These high temperatures will be used to destruct the SDC 100.

In an example, the high temperatures can be used to sublimate the CVPC material. In particular, a sufficient quantity of CVPC cubes 300 can be disposed such that opening of all of the chambers 302 of the quantity of CVPC cubes 300 causes the area to reach 120-200 degrees Celsius, which will sublimate the CVPC material in the cubes 300 and also CVPC material throughout the SDC 100. The temperature ranges (120-150 degrees C. and 120-200 degrees C.) used herein are only examples. In other examples the polymer used for the handle and/or a (CVPC) cube layer 102 is configured to disintegrate at a temperature outside of this range. In any case, however, the type of material, quantity, and location of the material and the chambers 120 is coordinated with the temperature at which the polymer in the handle and (CVPC) cube layer 102 disintegrates, such that the reaction of the material in the chambers 120 raises the SDC 100 to the temperature at which the polymer in the handle and (CVPC) cube layer 102 disintegrates.

In an example, the high temperatures caused by the alkali metal-oxygen reaction of the CVPC cubes 300 can be used for generation of hydrogen fluoride (HF) which then etches the oxide stack on the integrated circuit 104. Portions of the CVPC material within the SDC 100 can be implanted with fluorine (forming CVPC-F) to enable generation of the HF. In particular, the CVPC-F material can be disposed near one or more CVPC cubes 300 such that the heat generated by the alkali metal-oxygen reaction of the CVPC cubes 300 can vaporize the CVPC-F material. This vaporization releases the fluorine which forms HF in the air. The CVPC-F material can also be disposed such that the HF formed etches the silicon dioxide of the integrated circuit 104. For example, the handle of the integrated circuit 104 can be composed of CVPC-F. The thickness of the silicon dioxide layer on the integrated circuit 104 can be about 5 μm and can be dispersed with tiny metal lines. In an example, fluorine can comprise about 10 percent of the CVPC-F material and about 50-100 μm of CVPC-F can be included in the SDC 100 to sufficiently etch the oxide stack of the integrated circuit 104.

In an example, the high temperatures caused by the alkali metal-oxygen reaction of the CVPC cubes 300 can be used to generate an etchant such as $XeF_2$ vapor. The solid form of an etchant (e.g., $XeF_2$) can be mixed with portions of CVPC material or enclosed inside the chamber 302 of a subset (or all) of the CVPC cubes 300. The heat from the alkali metal-oxygen reaction can release the etchant, and the CVPC cubes 300 can be disposed such that the etchant, when released, etches the silicon of the integrated circuit 104. Once exposed to air $XeF_2$ will also form HF to etch silicon dioxide on the integrated circuit 104 (e.g., any leftover silicon dioxide that was not etched by the HF from the CVPC-F). The reaction of $XeF_2$ and silicon will sublimate the silicon.

In an example, the high temperatures caused by the alkali metal-oxygen reaction of the CVPC cubes 300 can be used to start a lithium hydride reaction with any unused fuel inside the fuel cell 106. Once the temperature from the alkali metal-oxygen reaction reaches 150 degree Celsius, any unused fuel inside the fuel cell 106 will start reacting will air generating significant amounts of heat to further aid in CVPC sublimation.

In some examples, one of the above processes is implemented in a given SDC 100 to self-destruct the SDC 100, however, in other examples multiple (e.g., all) of the above processes are implemented in a single SDC 100.

The vaporization timing can be controlled by electronic timing and material thicknesses. The amounts of HF and $XeF_2$ material required to etch 6-10 um of electronic device is below the MSDS safety limit (detail in Section III.A.1.c), thus have minimal environmental effects. The infrared radiation during the transient process (at 150 C) has a low power emission spectra in the 5-8 um wavelength band, where there is strong water vapor absorption. The transmission and detection of the IR radiation become very difficult (details in Section III.A.1.d). Therefore, thermal radiation during transient process will not be a concern for most inconspicuous deployment settings.

The remnants of the reaction are listed below, with no visible residues left behind. For example, the poly-carbonate material (CVPC) used in the CVPC cubes 300, as the structural component for the fuel cell 106, and as a top metal stack dielectric can be destructed by high temperature in the short term or ultraviolet radiation in the long term; this can result in no remnants (gas output) of the CVPC material. The silicon in the integrated circuit 104 can be destructed by reaction with an etchant (e.g., $XeF_2$/HF) as discussed above; this reaction can result in a liquid that evaporates. The silicon dioxide in the integrated circuit 104 can be destructed by HF etching as discussed above; this can result in a liquid that evaporates. The graphene used to cover the opening of the chamber 302, for sensors on the top layer 108 and/or bottom layer 102, and for interconnect links can be destructed by thermal reaction with air and by UV degradation; this can result in no remnants (gas output). The lithium hydride used as fuel in the fuel cell 106 can be destructed by reaction with air at 150 degrees Celsius as discussed above; this can result in an ash like residue that is dispersed during sublimation. The Rubidium or other alkali metal in the chamber 302 of the CVPC cubes 300 can be destructed by reaction with air; this can result in an ash like residue that is dispersed during sublimation. The Aluminum used for interconnects can be destructed by reaction with HF; this can result in an evaporatable liquid and too small to see microscale parts.

The SDC 100 can be configured to perform any appropriate function prior to self-destructing. For example, the SDC 100 can be configured to detect AC events such as power line fields and vehicle/metallic movement. The SDC 100 can be configured to detect audible signatures of machinery and human conversation. The SDC 100 can be configured to time stamp any of those events. The SDC 100 can be configured for covert operation by having a size less them 0.5 $cm^3$. The SDC 100 can be configured for 1 day and 100 hour operation. The SDC 100 can be configured to perform line of sight wireless communication (e.g., to an aircraft (UAV) above the SDC 100 to, for example, a distance of less than 1 Km. The SDC 100 can also be configured to perform wireless communication to another ground unit to a distance of 300 m. The SDC 100 can be configured to be individually identifiable via the wireless communication which allows mapping of a plurality of SDC 100 that are dispersed throughout an area.

Figure 4A:
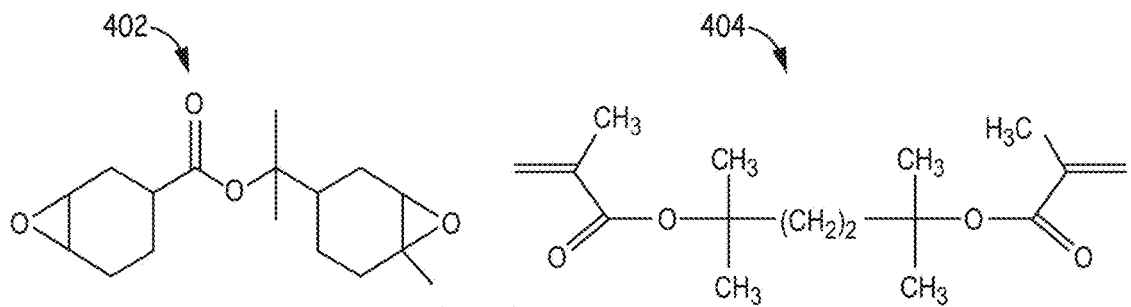
FIG. 4A is a structural formula of two example polymers on which the composition of structural portions of the SDC of FIG. 1A can be based.

Transience/Triggering Polycarbonate Chemistry and Thin Film Processing:

The polycarbonates (e.g., CVPC) used in the SDC 100 are designed to be degraded between 100° C. and 150° C., and also degrade with UV exposures over longer periods of time. These polymers can be prepared from cycloaliphatic precursors. These polymers can be based on photocurable methacrylates and epoxy thermosets developed by the Cornell University Ober group. Two examples of such a polymer are shown in FIG. 4A: a reworkable epoxy 402 and a methacrylate 404. The thermosets which are based on t-butyl esters were commercialized by Loctite (now Hüls) and performed well up to 180° C., at which temperature they degrade.

Figure 4B:
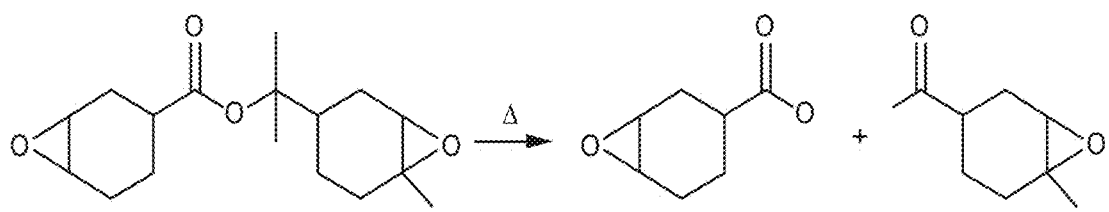
FIG. 4B is structural formula showing the breakdown of an example monomer on which the polymer used in structural portions of the SDC of FIG. 1A can be based.
Figure 4C:
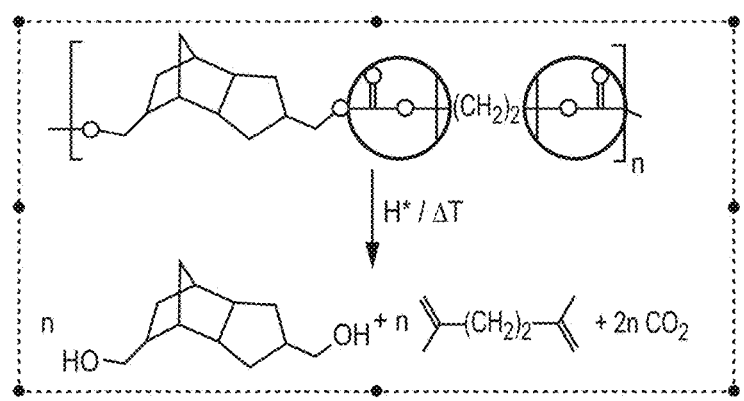
FIG. 4C is structural formula showing the degradation pathway of an example linear polycarbonate on which the polymer used in structural portions of the SDC of FIG. 1A can be based.

Activation energy of bond breakage is reduced compared to these thermosets to make the degradation of the polymer possible at lower temperature by changing the weak group from a t-butyl ester to a carbonate and incorporating a molecule such as a photoacid generator. Accordingly, these polycarbonates incorporate t-butyl esters as weak links in the polymer structures. These polycarbonates can be made by adjusting those first developed by Fréchet. One example of a scheme showing breakdown of a monomer when heated is shown in FIG. 4B. Light induced acid significantly drops the temperature of the scission step. FIG. 4C illustrates the degradation pathway of a linear polycarbonate. The glass transition temperature can be adjusted as needed. In an example, the Young's modulus is ~1 GPa before degradation with a dielectric constant of ~1.5. The removal process can be enhanced by incorporating photoacid generators, compounds that release acid on exposure to UV light. This is expected to reduce the degradation temperature to as low as 100° C. but may limit use conditions. CVPC-F can be used in portions of the CVPC in the top layer 108 to generate HF in air to etch ~6 µm of $SiO_2$ in the sensors of the transient top layer 108 and/or bottom layer 102.

OHBS 304 (Valve)

In an example, the OHBS 304 is a graphene sheet and uses graphene's unique property to exclude air molecules to isolate alkali metal in the chamber 302 from air. When sufficient current is passed through the graphene sheet, the graphene film will thermalize. The typical resistance of single layer or few layer graphene nanoribbons is $\rho$ ~100 µΩ-cm. In an example, the graphene sheet is a square graphene sheet of 250 µm×250 µm to cover the chamber 302 which holds a disintegration fuel or etchant. SDC 100 is configured to apply power in the range of 50 uW to 500 uW to the graphene sheet, which causes the graphene sheet to reach a temperature in the range of 150-190 C. This edge temperature will cause the graphene sheet to delaminate from the silicon nitride membranes to which the graphene sheet is attached. The temperature change of the graphene is dependent on the thermal capacity of the graphene, losses to the environment through the anchors, and air though convection and conduction. In an example, the time to thermal delamination will be under 1000 microseconds consuming nanoJoules of energy. In an example, 5V is applied across the graphene sheet to apply the power in the range of 30 mW to 500 mW.

$XeF_2$ Micro-Packets

Figure 5A:
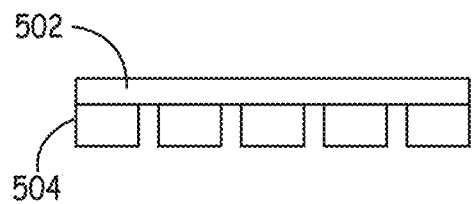
FIGS. 5A-5D illustrate example stages in a method of making micro-packets which can be used to hold an etchant for etching silicon in the SDC of FIG. 1A.
Figure 5B:
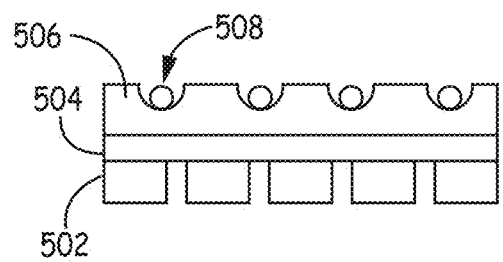
Figure 5C:
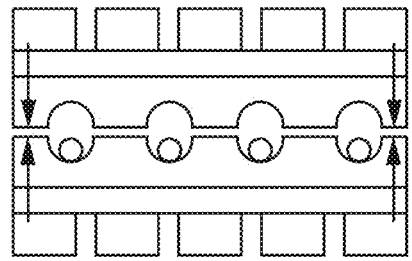
Figure 5D:

Cornell University has also made micro-packets of rubidium and lithium and which can be adapted to form polycarbonate containers for the etchant(s) (e.g., $XeF_2$). These containers can be used to incorporate the etchant into CVPC cubes 300 (instead of an alkali metal as discussed above) for destruction of silicon. An example process of forming such micro-packets is shown in FIGS. 5A-5D. A silicon dioxide layer 502 is grown or otherwise formed on a silicon handle 504. The silicon handle 504 is then etched as shown in FIG. 5A using, for example, a DRIE etching process. Wax 506 is deposited on the silicon dioxide layer 502 and an alkali metal 508 (e.g., rubidium) is deposited in a recess in the wax 506 (FIG. 5B). The steps described above are repeated to form a second such wafer structure with matching recesses, but without the alkali metal therein. The two structures are placed together with the wax sides touching such that their corresponding recesses align and enclose the alkali metal (FIG. 5C). The wax enclosures are then heat sealed at the wax softening temperature and the wax enclosures are released from the silicon/silicon-dioxide handle in HF (FIG. 5D). More detail regarding this process can be found in U.S. Pat. No. 7,666,485, which is hereby incorporated herein by reference. As mentioned above, an etchant such as $XeF_2$ can be used instead of the alkali metal to create etchant packets that can be incorporated into CVPC cubes 300. The micropackets are designed to limit the reaction by supply of oxygen. Therefore, the micropackets are not explosive—they do not contain the oxidizer within them. The micropackets can be arrayed such that each part of the integrated circuit 104 starts disintegrating in parallel in order to have quick transient time and prevent leaving part behind.

Transient High Density Power Source (Fuel Cell) 106

Figure 6:
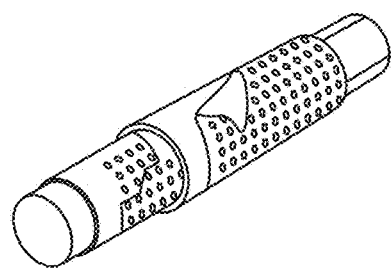
FIG. 6 is a perspective view of an example fiber fuel cell.
Figure 7:
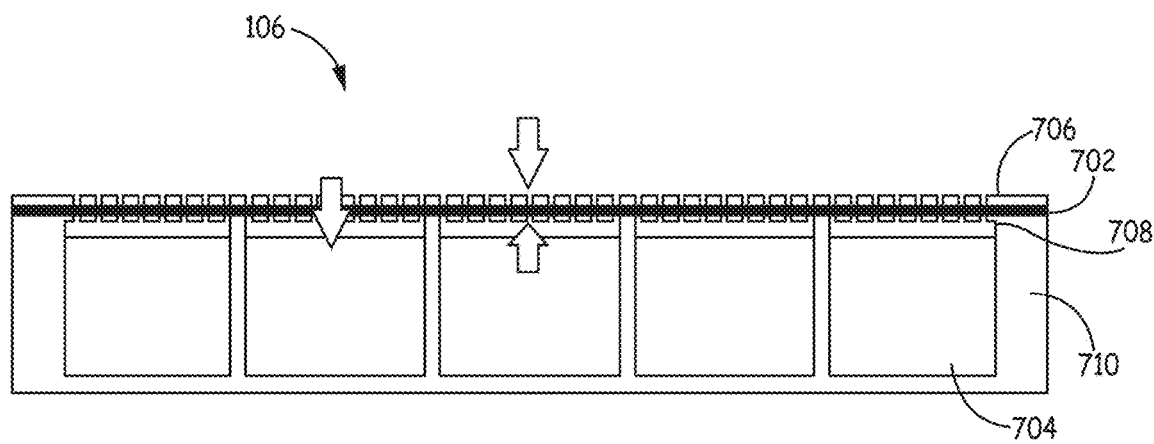
FIG. 7 is a cross-sectional view of an example planar fuel cell that can be used in the SDC of FIG. 1A.

As mentioned above, power for the SDC 100 can be provided by a fuel cell 106 within the SDC 100. In an example, the fuel cell 106 is a planar implementation of Honeywell's Fiber FuelCell (FC) technology (shown in FIG. 6), utilizing materials (CVPC, hydride fuel, proton exchange membrane) and structures that will enable complete transience. The technology uses both FC water recovery and pressure-based self-regulation to enable a simple, elegant power source with higher energy density (10-100×) than conventional thin-film Li and alkaline batteries. A cross-sectional view of an example of such a planar self-regulating FC 106 is shown in FIG. 7. The planar FC 106 comprises a $H_2$—$O_2$ proton exchange membrane (PEM) 702 tightly integrated with a $H_2O$-reactive $H_2$-generating hydride 704.

The FC 106 converts $H_2$ (generated internally) and $O_2$ (ambient air) to electrical energy, $H_2O$ vapor, and waste heat. $H_2O$ vapor—recovered via back-permeation through the PEM 702—reacts with the hydride 704 (hydrolysis reaction) to generate $H_2$. $H_2O$ recovery is driven by the large concentration gradient between the humid cathode 706 and dry anode 708, and facilitated by the intrinsically-high $H_2O$ vapor permeability and selectivity (to atmospheric gasses) of the PEM 702.

Lithium aluminum hydride (LAH) can be used as the hydride fuel 704, and the stoichiometry of the FC reaction and the hydrolysis reaction can be balanced, enabling the system to function with zero net $H_2O$ consumption. The FC 106 is regulated by an internal "self-regulation" mechanism, wherein rising $H_2$ pressure decreases the $H_2$ generation rate by reducing the rate of $H_2O$ back permeation and increasing the rate of $H_2$ permeation. Both mechanisms work in concert to stabilize the pressure and enable the FC 106 to operate without a valve—dramatically simplifying the system design. The FC 106 has a package 710 (including the fuel container) composed of CVPC which enables thermal transience of the packaging. The anode electrode 708 is patterned metal on the CVPC packaging 710. The anode and cathode electrodes destruct when the CVPC 710 destructs. The remaining materials (PEM, residual LAH fuel) will also be destroyed in the transience process, leaving behind a fine, inert dust comprised of Pt nanoparticles and $LiOH/Al(OH)_2$ micro particles that will be dissipated by a slight breeze.

Transient Ultra-Thin SOI/Polycarbonate Circuitry 104

Figure 8:
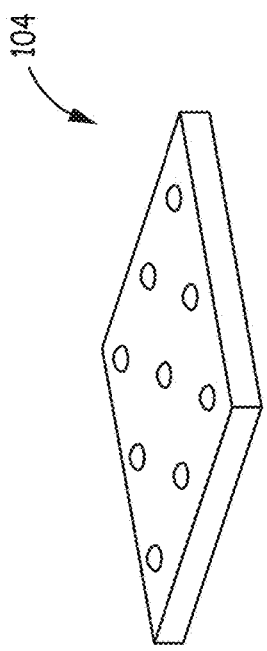
FIG. 8 is a perspective view of an example integrated circuit on a polymer handle that can be used in the SDC of FIG. 1A.

In an example, the integrated circuit 104 uses SOI-CMOS circuitry. FIG. 8 illustrates an example of the integrated circuit 104 on a polycarbonate handle (e.g., composed of CVPC) which can be made by eliminating the silicon handle on SOI wafers so only the tiny silicon islands forming the transistors above the SOI oxide surface survives, attached to a vaporizable poly-carbonate carrier wafer.

Following this procedure the polycarbonate encapsulated CMOS electronics can be less than 300 um thick, but compliant enough to be handled without breaking due to the flexible properties of the polycarbonate films. Conductive epoxy is applied to the electrical contact pads to bring in power and connections to the antenna for RF communications.

Ultra-Thin Sensor & Electronics in SOI

In an example, the sensor and electronics in the top layer 108 and/or bottom layer 102 are based on 0.35 um CMOS SOI technology. The silicon handle wafer portion of such a CMOS SOI die can be removed in the same manner as explained above with respect to the SOI CMOS die in the integrated circuit 104. The buried oxide layer of the SOI stack can protect the circuitry from performance degradation. Established devices, models and MR sensors can be used to create the necessary circuit blocks to support sensing, signal processing and wireless transmission.

Antenna Approach

SDC can use a micro sized antenna fabricated in the SOI of the top layer 108 for two-way wireless communications. The antenna impedance transforms to free space.

RF Wireless Communications

Figure 9:
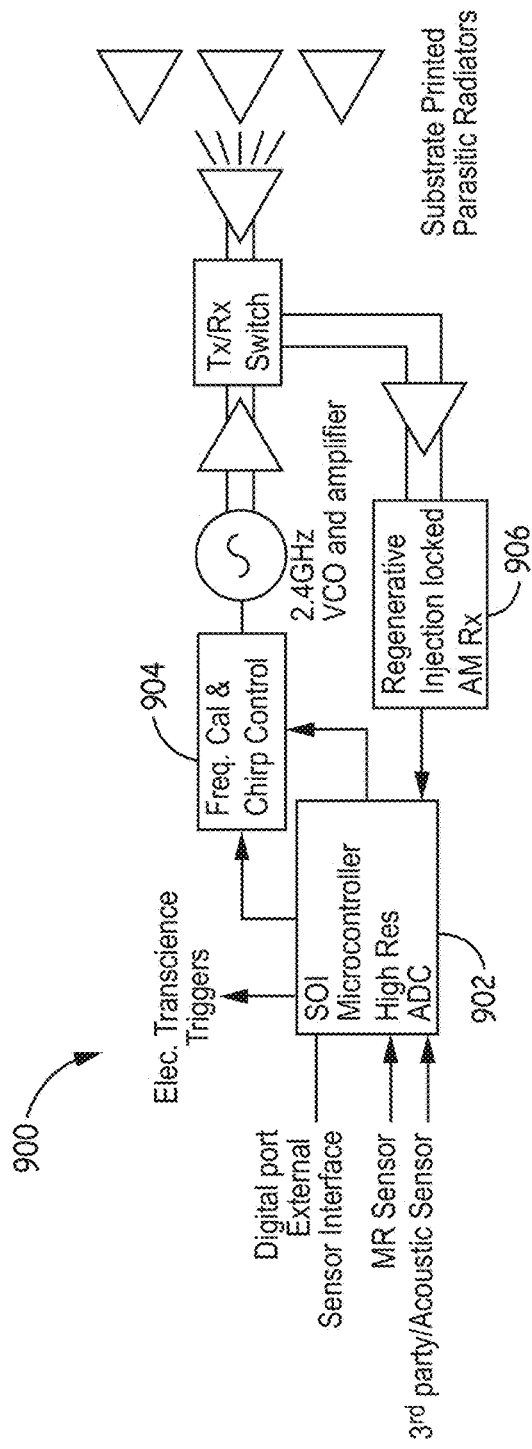
FIG. 9 is a block diagram of an example electronic circuit that can be included in the SDC of FIG. 1A.

FIG. 9 is a block diagram of an example of the wireless communication system 900 implemented in the SDC 100. The communication system 900 includes an external digital/sensor interface connected to a microcontroller 902 in the SOI of the integrated circuit 104. In an example, the SDC 100 uses wide band chirp approaches to embrace frequency uncertainty and provide a degree of signal spreading to reduce its overall EM signature.

The communication system 900 facilitates long range communication to and from the SDC 100. Unique frequency chirp transmission pulses 904 are used to distinguish ones/zeros with the base receiver using dispersive delay lines to recover the chirp waveform with high SNR/low bit error rate. The command receiver uses a technique to construct a low bit rate AM receiver using an injection locked oscillator 906 negating the need for on-chip frequency references/high Q elements.

Low overall power requirements are maintained through duty cycling of the sensor data acquisition, command reception and data transmission. $1^{st}$ order link budget results with 10 dBm transmit power point to LOS communications (elevated/airborne base station) ranges of 1 km.

Graphene as a Piezoresistive Element for Acoustic and Inertial Sensing

Graphene has the very nice property that it can easily vaporize when heated by oxidizing with oxygen to form $CO_2$ gas. Hence sensors and electronics made with graphene are used in SDC 100 to form vaporizable sensors. In an example, the sensors on the top layer 108 can be formed of the same graphene that is used as the OHBS 304 that delaminates or cracks to expose the chambers 302 of the CVPC cubes 300 to oxygen.

SDC Transient Process

Figure 10:
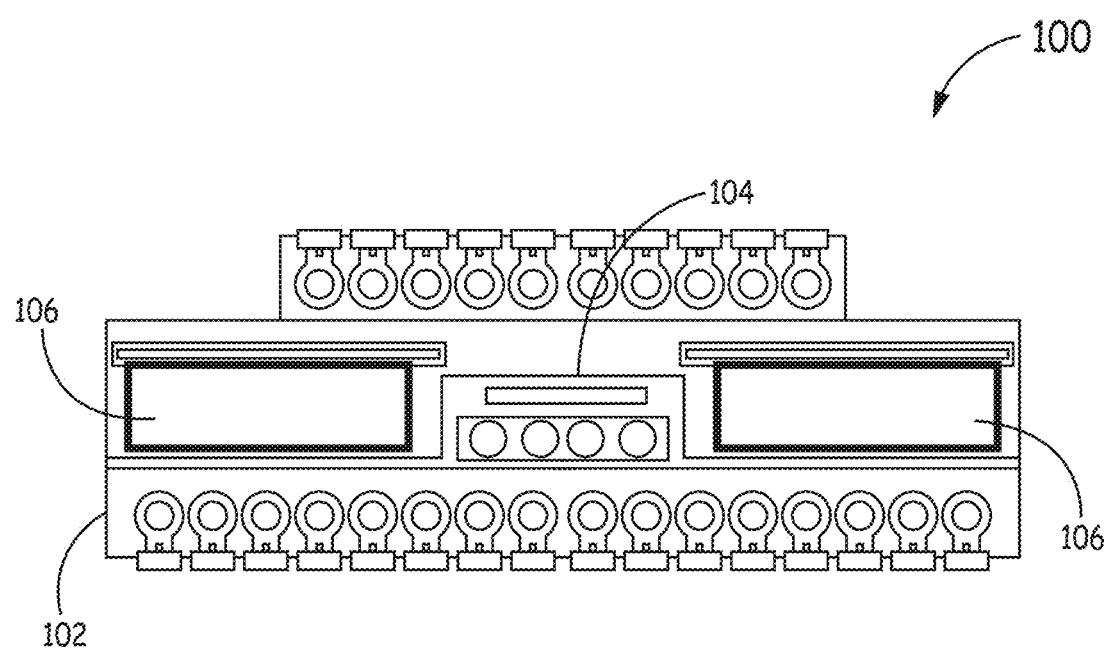
FIG. 10 is a cross-sectional view of an example SDC.
Figure 11:
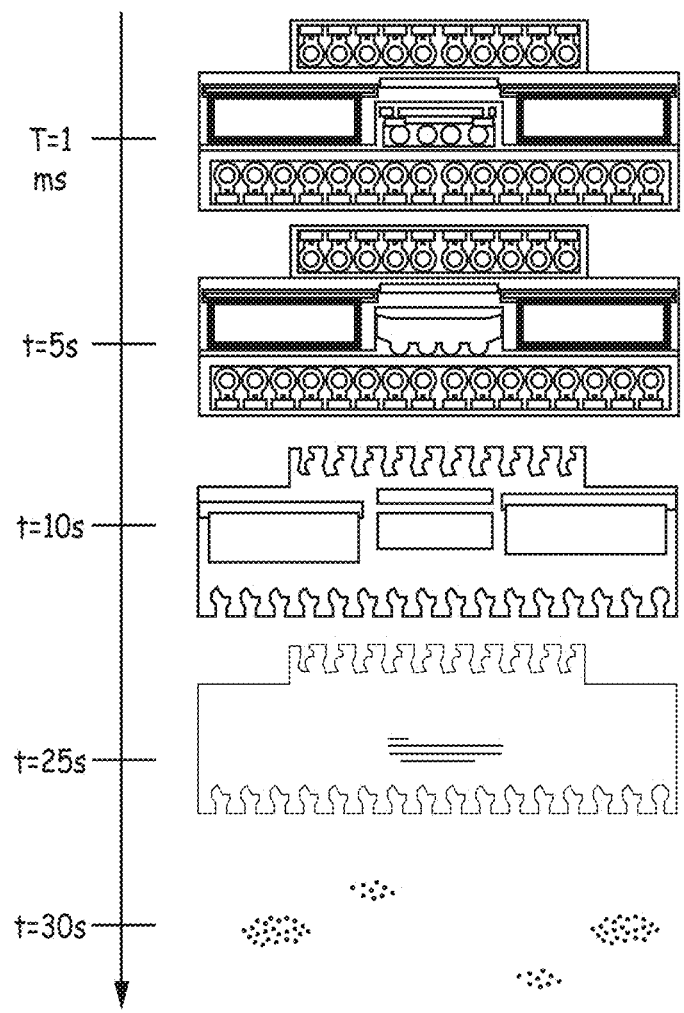
FIG. 11 is an illustration of an example self-destruction of the SDC of FIG. 10.
Figure 12:
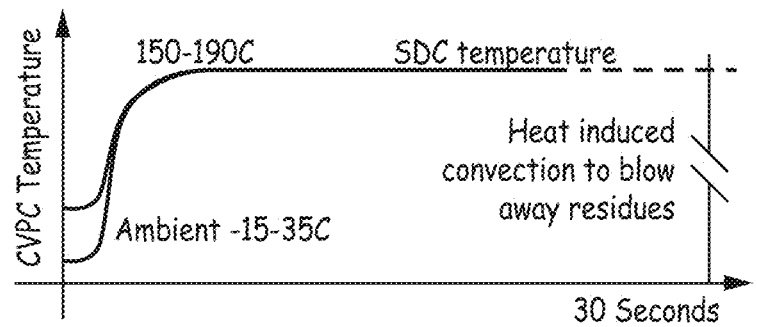
FIG. 12 is a graph of an example temperature vs. time of the SDC of FIG. 1A or 10 during self-destruction.

FIG. 10 is a cross-sectional view of an example SDC 100. An example of the SDC vaporization progression is shown in FIG. 11, and a graph showing the SDC temperature vs. time during the vaporization is shown in FIG. 12. First the OHBSs 304 are triggered taking several milliseconds. Oxygen reaction with rubidium will be a diffusion limited process flow, generating temperatures of 150-190 C. This temperature denatures the CVPC to vaporize it. At the core of the SDC 100, etchant (e.g., $XeF_2$) is released from pockets of CVPC cubes 300 nearby the integrated circuit 104 (e.g., from CVPC cubes 300 the top layer 108 and/or bottom layer 102) and HF can be formed from fluorine impregnated CVPC segments (e.g., from the CVPC-F in the handle of the integrated circuit 104) to dissolve the CMOS oxide and silicon layers of the SOI-CMOS die in the integrated circuit 104. These reactions are reaction rate limited and occur at elevated temperatures, and are expected to take 5 seconds.

The CVPC will continue to vaporize, breaking the nafion/PC continuum. This will expose the $LiAlH_4$ to react with large amounts of oxygen, rising its temperature, continuing to vaporize the battery CVPC as the last step. The total time for vaporization can be controlled by size and number of CVPC cubes. Smaller Rb spheres have higher surface to volume ratio, for faster oxygen diffusion and faster oxygen reaction and power output. Lithium hydrate from the fuel cell 106 (battery) will also contribute heating and it can be scaled to achieve faster heating and hence vaporization time. The remains of the process will be micro-sized particles of graphene flakes, nafion segments, and oxides of rubidium/lithium. These parts will be blow away by ambient wind and can be further dissolved with water.

Programmable SDC Transient Modes

Figure 13:
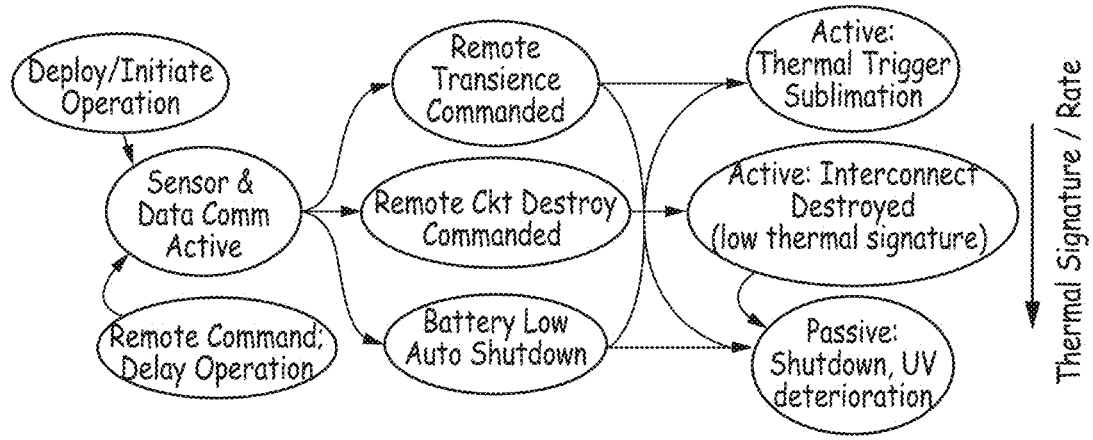
FIG. 13 is a flow diagram of an example command sequence implemented by the SDC of FIG. 1A or 10.

The SDC 100 is configured to have a field selectable transient modes. That is, once deployed and in use, the SDC 100 is configured to receive a command to self-destruct in one of a plurality of modes. In an example, the selectable self-destruct modes include 1) total/rapid transience, 2) partial destruction of only the electronics, or 3) slow degradation due to UV exposure. More of fewer self-destruct modes can be used in other examples. Each of these modes can be selected by remote command and provide the ability to adjust the thermal signature of the SDC during its transience. FIG. 13 is a flow diagram of an example command flow and sequencing for the SDC 100. The top path in FIG. 13 provides rapid transience metrics while the middle and bottom paths provide trade transience/time/thermal signature.

Heat Generation for Initiation and Vaporization

Figure 14:
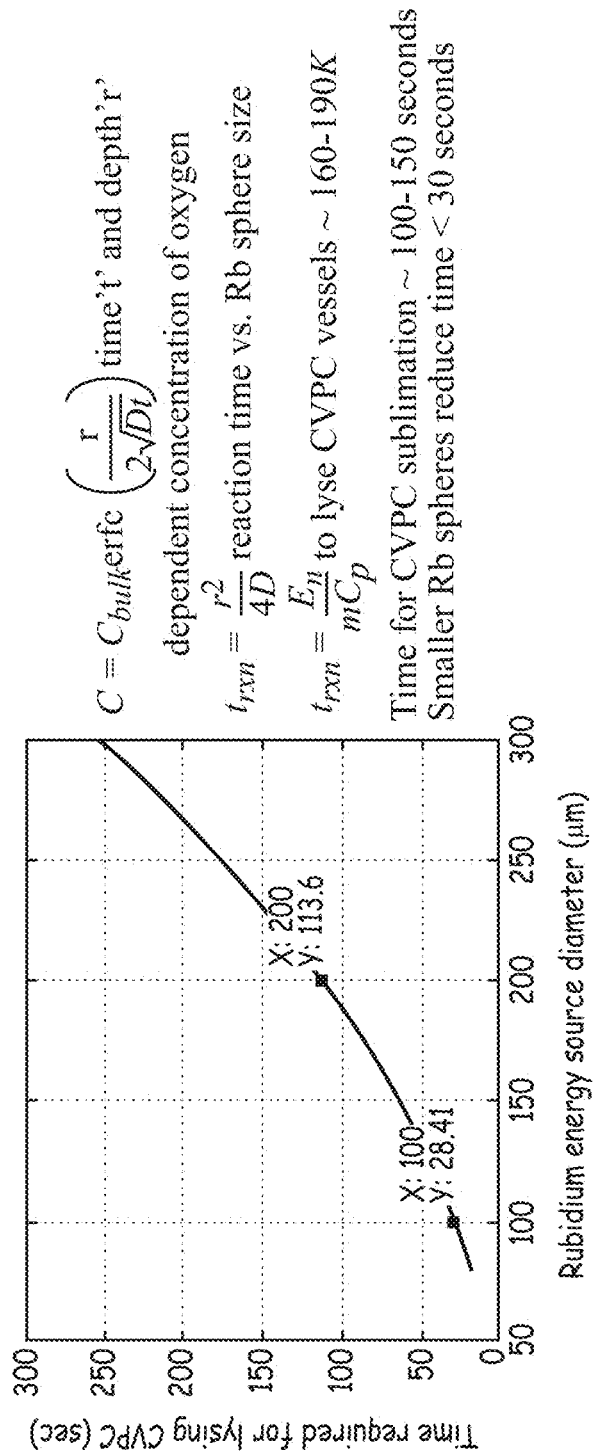
FIG. 14 is a graph illustrating an example relationship between the time for lysing CVPC and the diameter of a rubidium energy source for the SDC of FIG. 1A or 10.

A CVPC cube 300 for CVPC sublimation includes the OHBS 304 that gates supply of oxygen to the alkali metal (e.g., rubidium) stored inside as described above. First, the OHBS 304 is delaminated or cracked to allow diffusion limited oxidation of alkali metal inside it. After the graphene delamination or cracking, oxygen will diffuse into the chambers 302. In examples where rubidium is used as the alkali metal, the rubidium will react with excess oxygen to produce the superoxide $RbO_2$ in an exothermic reaction producing 278 kJ/mol of rubidium ($Rb+O_2 \rightarrow RbO_2$). Reaction of Rb (modeled as spheres) is limited by diffusion of oxygen into it. Equivalent number of moles and five times as many moles of air—a high flow rate making justifying the diffusion limited reaction model. The analysis assumes roughly equal diffusivity coefficients of oxygen through rubidium and rubidium oxide. The boundary conditions for the analysis using Fick's law of diffusion are $C(r,0)=0$. Ideally, there is no oxygen inside the rubidium before the OHBS 304 is opened $C(0,t)=C_{bulk}$. The $O_2$ concentration at the top surface is fixed and is equal to the bulk conc. With this information the time to reach the vaporization temperature for each sub-unit can be estimated. FIG. 14 is a graph illustrating an example heat generation of a CVPC cube 300. As seen in the graph in FIG. 14, by scaling the size of the rubidium packets while keeping the amount of rubidium constant, we can achieve 30 second vaporization time at rubidium ball diameter of ~100 um. CU will explore this design space of surface-to-volume ratio to achieve the desired metrics.

SDC Fabrication, Integration, and Packaging

FIGS. 15A-N illustrate example stages in the fabrication of a CVPC cube layer at the wafer level. Such a CVPC cube layer can be used for the bottom layer 102 and/or the top layer 108 of the SDC 100, for example. The CVPC cube layer provides a space for chambers 302, which can be filled with an etchant (e.g., $XeF_2$) and/or an alkali metal as discussed above, while allowing through-wafer holes, bumps and antenna patterns on top.

FIGS. 15A-N illustrate a single die of a CVPC cube layer, but it should be understood that multiple such die can be fabricated on a single wafer at the same time. Fabrication of the CVPC cube layer starts by processing a SOI wafer 1502 (FIG. 15A). This wafer 1502 is etched from backside using DRIE (or KOH) to dissolve most of the handle wafer, leaving silicon at the boundaries 1504 between adjacent dies to serve as mechanical support (FIG. 15B). In an example, this etch etches through all of the silicon bulk on the backside to reach the insulator layer (e.g., $SiO_2$). This is followed by pouring of the CVPC precursor 1506 and its curing to solidify in the carved regions of the handle wafer (FIG. 15C). In an example, the temperature ramp times and the solvent content of the CVPC 1506 are controlled to reduce cracks in the bulk material 1506 or silicon frame 1502 due to the tensile stress during CVPC curing due to volume shrinkage might lead. In another example, additives are used to reduce stress. At this stage, a planarization step can be used to level silicon and CVPC surfaces using a selective silicon etch such as one that employs $XeF2$ (FIG. 15D). Next CVPC UV-photoresist property is used using UV lithography to perform high aspect ratio patterning for through-wafer vias 1508 (FIG. 15E). Cylindrical via diameters will be 30 μm yielding an aspect ratio of roughly 8-10 for the 250-300 μm thick PC layer. At this stage, wafer is ready for high aspect ratio sputtering of copper 1520 (FIG. 15F). Complete filling up of 30 μm deep trenches with sputtering would require at least 15 μm of film thickness. In order to avoid deposition of such thick films (due to concerns on stress, peeling, processing time etc.), a trench filling process using CVPC in a vacuum environment for conformal priming of deep trenches (FIG. 15G) is used. After this process, extra CVPC 1512 on top of the copper layer 1510 will be etched using oxygen plasma, while copper acts as an etch stop (FIG. 15H). This copper layer 1510 will be removed by a wet etch using $FeCL_3$ to expose underlying CVPC layer 1506 (FIG. 17i). Exposing of CVPC layer 1506 on the frontside of the wafer can be realized by etching silicon and silicon dioxide using $XeF_2$ and HF, respectively (FIG. 15J).

At this point in the processing sequence we have a CVPC substrate with through-vias in addition to the silicon frame 1502 surrounding it. An interconnect/pad layer 1514 of Ti/Al is deposited on the top and/or bottom side and is coupled to the copper 1510 in the vias (FIG. 15K). In some examples, these interconnects/pads 1514 can be used for antennas and interconnects for sensors. In some examples, additional adhesion promoting layers such as molybdenum, or plasma treatments are used to roughen the surface, or use laser etching to create higher surface area for adhesion.

Next, indium bumps 1516 are droplet formed using the SonicMEMS sonic micropipette. Indium is chosen as a low-temperature solder material which reflows at a temperature lower than the vaporization temperature of CVPC. Chambers 302 in the CVPC are formed by laser micromachining technologies (e.g., those optimized at Cornell University), allowing fine alignment to existing patterns (FIG. 15M). Finally, an alkali metal 1518 such as Rb and/or an etchant such as $XeF_2$ 1520 are added into the chambers 120 (FIG. 17N). Integration of the OHBS 304 on the CVPC substrate is described next.

FIG. 16 illustrates example stages in the process of graphene deposition and patterning to form a graphene sheet for use as the OHBS 304 of a CVPC cube 300. This process starts with an SOI wafer 1602 (FIG. 16A). The back side 1604 of the wafer 1602 is etched to the oxide layer using DRIE or KOH (FIG. 16B). Graphene is deposited using CVD on a commercially available Cu-foil and singulated. In other examples, pyrolyzed photoresist and metal thin films can be used in addition to graphene. The copper foil is released by etching copper in $FeCl_3$. This leaves graphene floating on top of the solution (FIG. 16C). Graphene is then "picked-up" by bringing the device layer 1606 of the SOI wafer 1602 in contact with the graphene 1608, which is suspended on the surface of the copper etchant solution 1610 (FIG. 16D). After DI and HCl cleaning, this yields a graphene layer 1612 on the SOI wafer 1602 (FIG. 16E). The graphene layer 1612 is then patterned using oxygen plasma through a stencil mask (FIG. 16F) which can easily be fabricated using DRIE. Next, the graphene layer 1612 is transferred to the partially completed CVPC cube layer wafer (FIG. 15N) as shown in FIGS. 17A and 17B. The dies will then be depanelled by laser cutting or dicing. In an example, bonding occurs simply by van der Waals forces between graphene and the metal electrodes. In order to ensure graphene stiction to the surface, staple metals can be shadow evaporated through a stencil mask to increase the adhesion strength.

System Level Integration and Packaging Process Flow:

The SDC 100 includes a stack of five dies 102, 104, 106, 108, 110, which are shown in FIGS. 1A and 2. The process flow described above and illustrated by FIGS. 15A-N is used to fabricate several components throughout the SDC 100, which can ease the system integration. Assembly and bonding of the dies 102, 104, 106, 108, 110 can be performed using two different methods, for example: (i) flip-chip bonding using indium bumps and (ii) by using uncured CVPC precursor as the intermediate bonding agent. In flip chip bonding, Indium is chosen because it has a lower reflow temperature than the CVPC vaporization temperature. Bonding of the spacer and battery to CVPC substrates uses transient glue. Uncured CVPC can be used for this purpose by spray coating samples with 1-10 μm of its precursor. Then curing will result in the precursor serving as an intermediate bonding agent.

Acoustic Sensor Fabricated on CVPC Substrate

In an example, a pressure sensor composed of one or more graphene membranes as piezoresistive elements can be included in the top layer 108 and/or bottom layer 102. In an example, ultrasonic sensor/microphone sensors can be included in the top layer 108 and/or bottom layer 102. For such sensors, suspended graphene (over a chamber in CVPC) can used as the sensing resistors, and graphene with underlying CVPC support can be used as a reference substrate. The suspended graphene can be coupled with one or more reference graphenes in a Wheatstone bridge circuit. Typical resonance frequency for 25 μm diameter circular graphene can be calculated to be beyond 21 kHz.

Transient Polycarbonate Materials Chemistry

The polymer (polycarbonate) used for the CVPC throughout the SDC 100 makes use of the fragility of photoresists (the ability to break into small volatile fragments) combined with the stability (strength and toughness) of polymers used in PCB production. Polymers by their very nature do not evaporate since they possess essentially no vapor pressure. Their large molar mass alone precludes any volatility. However, the building blocks of polymers (monomers) are typically quite volatile. The polymer used in the CVPC is a polymer that can be triggered to break into small, volatile molecular fragments by incorporation of weak links, such that it vanishes on demand. Linear polymers require fewer links to be broken in order to produce volatile fragments than network polymers, so, in some examples, the polymer in the CVPC will be a linear polymer. In many cases polymers in the CVPC are in network form (such as thermosets) made by connecting the different components of a polymer in a molecular mesh, producing more robust materials but enhancing stability even further.

Polycarbonates are a class of polymers is known to have good mechanical strength and toughness. A polycarbonate used in SDC 100 is based on tertiary alcohols and related moieties that leave each carbonate group capable of degradation. The building blocks of the polycarbonate form volatile liquids rather than the stable solids left behind by commercial polycarbonates. In this way the polycarbonate can have the desired mechanical properties and the desired fragility.

The polymers include Bromine (Br) directly built into the basic monomers of the polymer and then take advantage of its presence in suppressing flame formation. A number of phosphorous or bromine containing molecules are known to act as flame retardants. Its location is not important, just its presence in the final material. The polymers can also include F into the building blocks of the basic polymer in order to make incorporation easier and to ensure it is completely dispersed throughout the entire transient substrate. The incorporation of fluorine (F) into the polymer serves several purposes. Fluorine is known to lower the dielectric constant of a polymer which will be useful in substrate design. It also improves moisture resistance. Finally in the degradation step fluorine can be released to form HF to aid in the degradation of other device components.

Graphene Stiction to SiN

In examples where a graphene sheet is used as the OHBS 304, the graphene sheet can be attached to the silicon nitride on the CVPC cube 300 under different pressures across the membrane. As the materials used for heat generation within the SDC package are highly reactive they can be processed in pressurized glove boxes/chambers leading to higher microcavity pressures than the atmosphere. The delamination across the graphene boundary can be determined based on the surface adhesion energy of graphene as a function of the external pressure during operation, $p_{ext}$. The relation between the delamination of the graphene membrane from the substrate can be determined by modeling the microcavity as a thermodynamical system with constant number of trapped gas molecules inside and minimizing its Free energy. This yields the adhesion energy as $$\Gamma = \frac{5C}{4}\left(p_0 \frac{V_0}{V_0 + V_b(a)} - p_{ext}\right)\delta$$

Where $V_0$ is the initial volume of the microcavity, $\Gamma$ is the graphene/substrate adhesion energy, $a_0$ is the initial radius before delamination, $V_b$ is the volume of the blister (excluding $V_0$), a is the final radius, $\delta$ is the maximum displacement (at the center) of the membrane, $p_{int}$ is the internal pressure, $p_{ext}$ is the external pressure. Here C is a constant of proportionality that determines the volume of the blister $V_b(a)=C(v)\pi a^2\delta$ and only depends on the Poisson's ratio v. For graphene Kroenig et al. takes v=0.16, which leads to C(v=0.516)=0.524. They also report the adhesion energy to be $\Gamma=0.45\pm0.02$ J/m$^2$ for monolayer graphene and $\Gamma=0.31\pm0.03$ J/m$^2$ for samples containing 2-5 graphene sheets.

Using the ideal gas law and assuming isothermal expansion, one has $p_0 V_0 = p_{int}(V_0 + V_b)$. Substituting it in the above equation yields $$\delta = \frac{4\Gamma}{5C\Delta p}.$$

Further manipulation of the equations yields the relation between membrane delamination $r_{delam}$ and the adhesion energy as:

$$r_{delam} = a - a_0 = \sqrt{\frac{5V_0\Delta p}{4\pi\Gamma}\left(\frac{p_0}{\Delta p + p_{ext}} - 1\right)} - a_0$$

FIGS. 18A and 18B shows the variation of delamination radius and maximum deflection (at the center) as a function of the chamber radius and height, when the chambers are initially filled up to $P_0=1$ MPa$\approx$10 atm in CVPC cube 300 and then brought to 1 atm. FIG. 18A illustrates an example delamination distance, a–a$_0$. FIG. 18B illustrates an example maximum displacement of a graphene sheet (used as an OHBS 304) as a function of the chamber 302 depth and radius. The initial priming pressure of the chamber 302 is taken to be approximately 10 atm. Once the chambers are brought to atmospheric environment, the graphene sheet bulges resulting in some delamination around the perimeter of the graphene sheet. Note that delamination distances calculated from theory are comparable to the fabricated channel radius.

The above numbers are calculated for graphene contacting the surface without any other adhesion mechanisms. In some examples, thin-film glue or staple layers are introduced to increase the adhesion energy described above. Here a thin metal film will be evaporated on the edges of the graphene. Here the adhesion can be much better as the failure will have to be the graphene slipping out of the molecular gap formed between the metal and the polycarbonate.

Sensor, Electronics & Wireless Links/Antenna

As discussed above, SDC 100 uses thinned SOI-CMOS substrates to reduce the electronics mass to be sublimated. Such thinned SOI-CMOS substrates (dies) can be used in the integrated circuit 104 as discussed above. In an example, the thinned SOI-CMOS substrates are formed by removing 500 micrometers of a silicon carrier, leaving only around 6 micrometers of silicon di-oxide and electronics. The Silicon-On-Insulator (SOI) integrated circuit technology uses post fabrication removal of the silicon carrier leaving a 6 um thick stack of transistor islands and circuit interconnect supported in SiO$^2$ inter layer dielectric. Using SOI wafers allows removal of the substrate (handle) by first bonding the device wafer to a carrier wafer. This carrier becomes a temporary handle during the process of grinding and etching the silicon handle wafer away using conventional grinding and wet or dry silicon etching. A layer of polycarbonate film can then be spin coated onto the oxide to provide enough stiffness for handling after dicing. The bonding agent can be modified to be compatible with the process flow to allow clean removal after dicing. After removal from the carrier, die can be placed in very low tack carriers, ready for attach to the PC substrate.

In an example, SDC includes a 2 axis magnetometer. As a secondary sensor the SDC can include an acoustic sensor.

Wireless Communications & Antenna

As mentioned above, the integrated circuit 104 can include a wireless transceiver and control electronics. These electronics can use low power RF CMOS low IF radio technology, duty cycling, and can leverage the high internal impedance of the internal circuits to reduce power dissipation. These electronics can also use an all differential implementation to reduce bypass/power supply condition capacitors along with wideband chirp modulation techniques to reduce the need for precision frequency reference elements. These electronics can also use ground/array antenna patterns to increase radiation near the horizon (e.g., a 5 degree slant angle) and to improve the link margin for ground based reception units. The SDC 100 can be configured to coordinate with other SDC 100 within range to relay communications.

Waveforms/Command Set

To accommodate the limitations posed by SDC's small size and to maximize the covertness of the unit while transmitting, the wireless transceiver can be configured to transmit and/or receive a chirp FM waveform, which can be created by scanning an internal VCO. It can be matched to commercially available SAW, coax twin, or DSP based dispersive delay lines detection to form a one/zero by sweeping one freq range or a second band—effectively providing for non-coherent FSK demodulation of the transmitted signal.

On board VCOs using internal LC reactive elements operate over 10% bandwidths at ease—providing for 240 MHz spread bandwidth when operating in/around the 2400 MHz ISM band. A spreading gain of 10 log(240M/10K)>40 dB will be established for data communication rates of 10 Kbaud. To accommodate process variation in capacitor/inductance values, break links/resistor trimming can be used to trim the operating frequencies into an acceptable range.

For the command link back to the SDC 100, to reduce RF emissions an injection locked ASK style receiver can be used. The injection lock circuit can be set short of self-oscillation without the intended signal being present thereby eliminating detection of local oscillator leakage while waiting to demodulate a command. Circuitry can be based on prior patented command receiver can be used, which is described in U.S. Pat. No. 5,603,111, titled "Synchronous tracking AM receiver", which is hereby incorporated herein by reference.

Processing of wireless command received can be performed using a commercial COTs SOI microcontroller in the integrated circuit 104. The microcontroller (or more generally, the electronics on the integrated circuit 104) can be configured to respond to one or more commands received via a wireless signal. Examples of the one or more commands that the integrated circuit 104 can respond to include an on command, an off command, timing settings (e.g., delay) for one or more of the sensors, real time sensor operation command, slow/cold transience mode command, rapid transience mode command, delete stored data command, delay and wakeup duration command, and a transmission ID command. The transmission ID can be used for RF geolocation or multi-lateration.

Wireless Electronics

Circuit implementations for the wireless electronics can follow conventional system development and specification flow down to the sub-circuit level.

Antenna

In an example, the small aperture of the antenna used for the wireless transceiver in SDC 100 provides for low gain of approximately −12 dBi. In an example, the SDC 100 attempts to emphasize gain within the available aperture, emphasize low angle propagation against non-PEC's and provide structures and interconnect that are unlikely to attract attention or are prohibitive for transience properties.

In an example, the antenna includes a driving element and parasitic arrayed radiators populating the external surface of the polycarbonate substrate. This provides the ability to make full use of the surface areas of the package without difficult interconnects.

Link Budgets

In an example, the wireless transceiver has a transmission power of +10 dBm, a receiver NF of <5 dB, and a base receive antenna gain of 7 dB.

Fuel Cell 106 Fabrication

In an example, the FC 106 components are fabricated on CVPC substrates. The fuel container 710 can be formed by embossing CVPC to create micro pockets for hydride fuel pellets. The electrodes 706, 708 can be formed by patterning a metal lattice (100 nm thick) on CVPC substrates using a shadow mask—the lattice will breakup upon vaporization of the CVPC substrate. Channels to provide reactants to the PEM 702 can be either embossed or cut into the substrate using laser micromachining COTS PEMs 710 with catalyst/electrodes can be cut into a lattice using laser micromachining, and adhered to the FC electrode 706, 708 with a CVPC-based adhesive. Similarly, the FC assembly can be adhered to the fuel chamber 710 using a CVPC-based adhesive. The adhesive forms a gas seal between the FC assembly and fuel chamber 710, and mechanically stiffens the structure to contain the pressure generated by the hydrolysis reaction.

The FC 106 comprises four cells operating at 0.75V each and connected in series to provide a 3V nominal output. Internal tabs form the series connections when assembled. The FC 106 surface area is sized to deliver the power required by the electronics in the integrated circuit 104. The LAH fuel 704 is processed using a jet milling process to produce a particle size of ~5 μm. LAH can be pressed into micro pellets using a custom die and hydraulic press, in a nitrogen purged glove box. The micro pellets can be placed in the pockets in the CVPC fuel chamber 704 and sealed in the glove box environment.

FC 106 Performance

In an example, the FC 106 has a 10 mm by 10 mm footprint and is 4.4 mm thick, and has a projected energy density is $$1200 \frac{Whr}{l}.$$

The FC 106 is designed to deliver the electrical and thermal energy required by SDC 100 over its life cycle. In an example, the FC 106 is configured to provide an average power of 5.25 mW, a cell potential of 0.75V, and has 4 cells coupled in series. Accordingly, the FC 106 is configured to provide 3V and has a lifetime of 100 hrs. In an example, the FC 106 is configured to provide 5.25 mWhrs of electrical energy and 22 mWhrs of thermal energy for transcience. In an example, the CVPC in the FC 106 has a mass of 216 mg and the FC 106 has an energy density of 1200 Whr/l.

FC 106 Energy Analysis

In an example, the average power consumption of SDC 100 is 5.25 mW over its 100 hr lifetime, and thus would use 5.25 mW*100 hr=5.25 mWhr of electrical energy. In an example, the mass of LAH included in the fuel cell (FC) 106 to provide electrical energy for SDC 100 is $$525 \text{ mW}hr * \frac{1}{1.02} \frac{5}{Whr} = 131 \text{ mg}.$$

Heat energy is used to vaporize the FC 106 at the end of its operational life. During transience, LAH reacts via a multi-step reaction (combined thermolysis, hydrolysis, and oxidation) that can be summarized as: LiAlH$_4$+ 2H$_2$→LiOH+Al(OH)$_3$. During transience, the enthalpy change for reaction is converted to heat, and the heat released is around 43554 J/g. In an example, the mass of LAH fuel 704 included in the FC 106 for vaporization is 2.3 mg, and the total amount of LAH included in the FC 106 for both electrical power generation and vaporization is 131 mg|2.3 mg=133.3 mg. In some examples, LAH may be added to extend the lifetime or provide additional heat to vaporize other components, as desired.

FC 106 Power Analysis

The power density $$\left(\frac{\text{power}}{\text{area}}\right)$$

of FCs utilizing H$_2$O recovery is limited by H$_2$O back-permeation through the PEM. This rate depends in a complex way on the hydrolytic properties of the membrane (proton conductivity, H$_2$O uptake, diffusivity, osmotic drag), RH, and temperature. Further, when FCs operate in a pressure-based "self-regulating" mode, the power density also depends on the internal pressure, which impacts hydraulic back-permeation through the PEM. In an example, the average power density of the H$_2$O recycling, self regulating FC 106 over the extremes of environmental humidity (10-90%) and at $$\left(0.75 \frac{V}{\text{cell}}\right)$$

ranges from $$8 \frac{mW}{cm^2}$$

at 10% RH to $$60 \frac{mW}{cm^2}$$

at 90% RH. Based on this the FC 106 area for an example SDC 100 is at least 0.66 cm$^2$.

The FC 106 can also provide the power pulses required during Tx/Rx of the wireless transceiver. In electrochemical systems, a layer of charge at the electrode/electrolyte interface stores electrical energy and behaves like an electrical capacitor. This so-called double-layer capacitance is the product of the specific surface area, the differential capacitance, and thickness of the electrode. Using typical values, the capacitance per unit area is $$4125 \frac{m^2}{cm^2} * 2E^{-6} \frac{F}{cm^2} * 1E^{-3}m = 8.25E^{-2} \frac{F}{cm^2}.$$

The charge delivered per 0.5 s, 16 mA current pulse is 0.5 s*16 mA=5 mC. The corresponding potential drop in the FC 106 during each pulse can be 0.9V. Thus the FC 106 potential decreases from 3V to 3V−0.19V=2.81V during each current pulse, which is within with the 2.7-3.3V operating range for the SDC electronics.

Example Embodiments

Example 1 includes a self-destructing chip comprising: a first die including an electronic circuit; a second die composed of one or more polymers that disintegrate at a first temperature, the second die defining a plurality of chambers, wherein a first subset of the chambers contain a material that reacts with oxygen in an exothermic manner, wherein a second subset of the chambers contain an etchant to etch materials of the first die, wherein in response to a trigger event, the electronic circuit is configured to: expose the material in the first subset of chambers to oxygen in order to heat the second die to at least the first temperature; and release the etchant from the second subset of the chambers to etch the first die.

Example 2 includes the self-destructing chip of Example 1, wherein each of the first subset of chambers has an oxygen and humidity barrier sheet (OHBS) covering an opening of each of the first subset of chambers, the OHBS coupled between two electrodes, such that each of the first subset of chambers can be opened by passing current through the OHBS between the two electrodes causing the OHBS to delaminate or crack.

Example 3 includes the self-destructing chip of Example 2, wherein each OHBS is laminated to a silicon nitride layer that defines an opening to the respective chamber.

Example 4 includes the self-destructing chip of any of Examples 2-3, wherein the trigger event includes a command to self-destruct the chip, wherein the electronic circuit comprises a wireless transceiver configured to receive a wireless signal including the command, wherein in response to the command the electronic circuit couples a voltage to the second die, wherein the second die is configured such that the voltage is coupled to the two electrodes of each of the first subset of chambers, causing current to pass though the OHBS of each of the first subset of chambers.

Example 5 includes the self-destructing chip of any of Examples 2-4, wherein the trigger event is an end of a period of time, wherein the electronic circuit is configured to couple a voltage to the second die at the end of a period of time, wherein the second die is configured such that the voltage is coupled to the two electrodes of each of the first subset of chambers, causing current to pass though the OHBS of each of the first subset of chambers.

Example 6 includes the self-destructing chip of any of Examples 2-5, wherein each OBHS is composed of graphene.

Example 7 includes the self-destructing chip of any of Examples 1-6, wherein the first die is mounted to the second die, wherein the self-destructing chip comprises: a third die disposed adjacent the side of the first die that is reverse of the second die such that the first die is disposed between the second die and the third die, wherein the third die is composed of one or more polymers that disintegrate at the first temperature, the third die defining a third plurality of chambers, wherein at least a subset of the third plurality of chambers contain a material that reacts with oxygen in an exothermic manner, wherein in response to a trigger event, the electronic circuit is configured to expose the material in the at least a subset of the third plurality of chambers to oxygen in order to heat the third die to at least the first temperature.

Example 8 includes the self-destructing chip of Example 7, wherein at least one of the second die and the third die has an acoustic sensor thereon that is composed of graphene.

Example 9 includes the self-destructing chip of any of Examples 7-8, wherein at least one of the second die and the third die has an antenna thereon that is fabricated in a silicon substrate that is attached to the one or more polymers, wherein the trigger event is a command in a signal received at the antenna.

Example 10 includes the self-destructing chip of any of Examples 7-9, comprising: a fuel cell coupled to the electronic circuit, the fuel cell having a container composed of one or more polymers that disintegrate at the first temperature.

Example 11 includes the self-destructing chip of any of Examples 1-10, wherein the etchant is xenon di-fluoride, wherein the xenon di-fluoride is configured to etch a silicon substrate of the first die to disintegrate the first die.

Example 12 includes the self-destructing chip of any of Examples 1-11, wherein exposing the material in the first subset of chambers to oxygen includes exposing the material to air.

Example 13 includes the self-destructing chip of any of Examples 1-12, wherein the one or more polymers that disintegrate at the first temperature is configured to degrade within 1 month by ultraviolet light in sunlight.

Example 14 includes the self-destructing chip of any of Examples 1-13, wherein the first die includes an electronic circuit on a handle composed of one or more polymers that disintegrate at the first temperature, wherein the electronic circuit includes a silicon on insulator substrate, and the one or more polymers in the handle have a hydrofluoric acid precursor integrated therein, such that as the handle disintegrates, the hydrofluoric acid precursor combines with hydrogen to create hydrogen fluoride to etch silicon dioxide of the silicon on insulator substrate.

Example 15 includes a method of fabricating a die that is composed of one or more polymers having a plurality of chambers therein, the method comprising: etching a backside of a first silicon on insulator wafer substrate to form a recess; placing the one or more polymers in the recess; curing the one or more polymers; etching the silicon and insulator on the frontside of the wafer to remove the silicon and insulator from the one or more polymers; laser micromachining a plurality of chambers in the one or more polymers, wherein the chambers are open at a first surface of the one or more polymers; placing one of an alkali metal or an etchant in the plurality of chambers; and placing oxygen and humidity barrier sheets (OHBSs) over respective openings of the plurality of chambers.

Example 16 includes the method of Example 15, comprising: prior to etching the silicon on insulator on the frontside of the wafer, patterning a plurality of through wafer vias through the one or more polymers to the insulator of the silicon on insulator wafer; depositing a metal in each of the through wafer vias; filling the remaining portion of the through wafer vias with one or more polymers; etching excess of the one or more polymers on the backside to expose the metal in the through wafer vias; and depositing an interconnect layer on the backside of the one or more polymers such that the interconnect layer contacts the metal in the through wafer vias.

Example 17 includes the method of Example 16, wherein the OHBSs contact and are connected in series between two electrodes formed in the interconnect layer.

Example 18 includes the method of Example 17, comprising: depositing a second interconnect layer on the frontside of the one or more polymers such that the second interconnect layer contacts the metal in the through wafer vias thereby forming conductive vias; and placing indium bumps on the frontside of the one or more polymers such that the indium bumps contact the second interconnect layer.

Example 19 includes the method of any of Examples 15-18, wherein the OHBSs are graphene sheets, the method comprising: etching a backside of a second silicon on insulator wafer substrate; depositing graphene on a copper foil; placing the graphene on the copper foil in a solution of iron tri-chloride which etches the copper foil and leaves the graphene floating on the solution; bringing the frontside of the second silicon on insulator wafer into contact with the graphene, which causes the graphene to adhere to the frontside of the second silicon on insulator wafer; patterning the graphene such that the graphene forms a plurality of sheets each having a size and shape to cover the opening of a respective one of the plurality of chambers in the one or more polymers; bringing the graphene on the frontside of the second silicon on insulator wafer into contact with the handle including the one or more polymers; and wherein placing OHBSs over an opening of the plurality of chambers includes transferring the graphene from the frontside of the second silicon on insulator wafer to the one or more polymers such that the graphene covers the openings of plurality of the chambers.

Example 20 includes a self-destructing chip comprising: a first die including an electronic circuit on a handle composed of one or more polymers that disintegrate at a first temperature, the electronic circuit including a wireless transceiver, wherein the electronic circuit includes a silicon on insulator substrate having a silicon bulk substantially removed, and the one or more polymers in the handle have a hydrofluoric acid precursor integrated therein, such that as the handle disintegrates, the hydrofluoric acid precursor combines with hydrogen to create hydrogen fluoride to etch silicon dioxide and metals of the electronic circuit; a power source coupled to the first die and configured to provide operating power for the electronic circuit; at least one sensor coupled to the electronic circuit; a second die composed of one or more polymers that disintegrate at a first temperature, the second die defining a plurality of chambers, wherein a first subset of the chambers contain a material that reacts with oxygen in an exothermic manner, wherein a second subset of the chambers contain an etchant to etch materials of the first die, wherein each of the plurality of chambers has a graphene sheet covering an opening of the respective chamber, the graphene sheet coupled between two electrodes, such that the plurality of chambers can be opened by passing current through the graphene sheet between the two electrodes causing the graphene sheet to delaminate or crack, wherein the electronic circuit is configured to: obtain information from the at least one sensor; transmit a first signal using the wireless transceiver, the first signal including the information from the at least one sensor; receive a second signal using the wireless transceiver, the second signal including a command to self-destruct the chip, in response to the command, couple a voltage to the electrodes of the plurality of chambers causing the graphene sheets to delaminate or crack, exposing the material in the first subset of chambers to oxygen in order to heat the second die to at least the first temperature, and releasing the etchant from the second subset of the chambers to etch the first die.

What is claimed is:
1. A self-destructing chip comprising:
a first die including an electronic circuit;

a second die composed of one or more polymers that disintegrate at a first temperature, the second die defining a plurality of chambers, wherein a first subset of the chambers contain a material that reacts with oxygen in an exothermic manner, wherein a second subset of the chambers contain an etchant to etch materials of the first die;

wherein each of the first subset of the chambers comprises a valve, covering an opening of each of the first subset of chambers, where said valve is electrically coupled to the electronic circuit; and wherein in response to a trigger event, the electronic circuit is configured to generate a voltage and cause current to pass through, and open, valves to:
expose the material in the first subset of chambers to oxygen in order to heat the second die to at least the first temperature; and
release the etchant from the second subset of the chambers to etch the first die.

2. The self-destructing chip of claim 1, wherein each valve is an oxygen and humidity barrier sheet (OHBS), where the OHBS opens by at least one of delaminating and cracking.

3. The self-destructing chip of claim 2, wherein each OHBS is laminated to a silicon nitride layer that defines an opening to the respective chamber.

4. The self-destructing chip of claim 2, wherein each OBHS is composed of graphene.

5. The self-destructing chip of claim 1, wherein the trigger event is an end of a period of time, wherein the electronic circuit is configured to couple the voltage to the second die at the end of a period of time.

6. The self-destructing chip of claim 1, wherein the trigger event includes a command to self-destruct the chip, wherein the electronic circuit comprises a wireless transceiver configured to receive a wireless signal including the command, wherein in response to the command the electronic circuit couples the voltage to the second die.

7. The self-destructing chip of claim 1, wherein the first die is mounted to the second die, wherein the self-destructing chip comprises:
a third die disposed adjacent the side of the first die that is reverse of the second die such that the first die is disposed between the second die and the third die, wherein the third die is composed of one or more polymers that disintegrate at the first temperature, the third die defining a second plurality of chambers, wherein at least a subset of the second plurality of chambers contain a material that reacts with oxygen in an exothermic manner,
wherein each of the subset of the second plurality of chambers comprises the valve, covering an opening of each of the first subset of chambers, where said valve is electrically coupled to the electronic circuit; and
wherein in response to a trigger event, the electronic circuit is configured to generate a voltage and cause current to pass through, and open, valves to expose the material in the at least the subset of the second plurality of chambers to oxygen in order to heat the third die to at least the first temperature.

8. The self-destructing chip of claim 1, wherein the second die comprises an acoustic sensor thereon that is composed of graphene.

9. The self-destructing chip of claim 1, wherein the second die comprises an antenna on the one or more polymers, wherein the trigger event is a command in a signal received at the antenna.

10. The self-destructing chip of claim 1, comprising:
a fuel cell coupled to the electronic circuit, the fuel cell having a container composed of one or more polymers that disintegrate at the first temperature.

11. The self-destructing chip of claim 1, wherein the etchant is xenon di-fluoride, wherein the xenon di-fluoride is configured to etch a silicon substrate of the first die to disintegrate the first die.

12. The self-destructing chip of claim 1, wherein exposing the material in the first subset of chambers to oxygen includes exposing the material to air.

13. The self-destructing chip of claim 1, wherein the one or more polymers that disintegrate at the first temperature is configured to degrade within 1 month by ultraviolet light in sunlight.

14. The self-destructing chip of claim 1, wherein the first die includes an electronic circuit on a handle composed of one or more polymers that disintegrate at the first temperature, wherein the electronic circuit includes a silicon on insulator substrate, and the one or more polymers in the handle have a hydrofluoric acid precursor integrated therein, such that as the handle disintegrates, the hydrofluoric acid precursor combines with hydrogen to create hydrogen fluoride to etch silicon dioxide of the silicon on insulator substrate.

15. A self-destructing chip comprising:
a first die including an electronic circuit on a handle composed of one or more polymers that disintegrate at a first temperature, the electronic circuit including a wireless transceiver, wherein the electronic circuit includes a silicon on insulator substrate having a silicon bulk substantially removed, and the one or more polymers in the handle have a hydrofluoric acid precursor integrated therein, such that as the handle disintegrates, the hydrofluoric acid precursor combines with hydrogen to create hydrogen fluoride to etch silicon dioxide and metals of the electronic circuit;
a power source coupled to the first die and configured to provide operating power for the electronic circuit;
at least one sensor coupled to the electronic circuit;
a second die composed of one or more polymers that disintegrate at a first temperature, the second die defining a plurality of chambers, wherein a first subset of the chambers contain a material that reacts with oxygen in an exothermic manner, wherein a second subset of the chambers contain an etchant to etch materials of the first die,
wherein each of the plurality of chambers has a graphene sheet covering an opening of the respective chamber, the graphene sheet coupled between two electrodes, such that the plurality of chambers can be opened by passing current through the graphene sheet between the two electrodes causing the graphene sheet to delaminate or crack,
wherein the electronic circuit is configured to:
obtain information from the at least one sensor;
transmit a first signal using the wireless transceiver, the first signal including the information from the at least one sensor;
receive a second signal using the wireless transceiver, the second signal including a command to self-destruct the chip,
in response to the command, couple a voltage to the electrodes of the plurality of chambers causing the graphene sheets to delaminate or crack, exposing the material in the first subset of chambers to oxygen in order to heat the second die to at least the first temperature, and releasing the etchant from the second subset of the chambers to etch the first die.

\* \* \* \* \*